(12) United States Patent
Fang et al.

(10) Patent No.: US 7,919,367 B2
(45) Date of Patent: Apr. 5, 2011

(54) METHOD TO INCREASE CHARGE RETENTION OF NON-VOLATILE MEMORY MANUFACTURED IN A SINGLE-GATE LOGIC PROCESS

(75) Inventors: Gang-feng Fang, Alameda, CA (US); Dennis Sinitsky, Los Gatos, CA (US); Wingyu Leung, Cupertino, CA (US)

(73) Assignee: MoSys, Inc., Santa Clara, CA (US)

( * ) Notice: Subject to any disclaimer, the term of this patent is extended or adjusted under 35 U.S.C. 154(b) by 286 days.

(21) Appl. No.: 12/021,229

(22) Filed: Jan. 28, 2008

(65) Prior Publication Data
US 2008/0138950 A1    Jun. 12, 2008

Related U.S. Application Data

(62) Division of application No. 11/341,881, filed on Jan. 26, 2006.

(51) Int. Cl.
*H01L 21/8238* (2006.01)

(52) U.S. Cl. ........ 438/201; 438/211; 438/593; 438/734; 257/E21.179

(58) Field of Classification Search .................. 438/201, 438/211, 257, 593, 734, 737; 257/E21.179, 257/E21.422
See application file for complete search history.

(56) References Cited

U.S. PATENT DOCUMENTS

| | | | |
|---|---|---|---|
| 4,811,076 A | 3/1989 | Tigelaar et al. |
| 5,108,941 A | 4/1992 | Paterson et al. |
| 5,198,995 A | 3/1993 | Dennard et al. |
| 5,301,150 A | 4/1994 | Sullivan et al. |
| 5,365,486 A | 11/1994 | Schreck |
| 5,394,365 A | 2/1995 | Tsukikawa |
| 5,414,671 A | 5/1995 | Fukumoto |
| 5,479,367 A | 12/1995 | Maurelli et al. |
| 5,504,706 A | 4/1996 | D'Arrigo et al. |
| 5,511,020 A | 4/1996 | Hu et al. |
| 5,554,552 A | 9/1996 | Chi |
| 5,600,598 A | 2/1997 | Skjaveland et al. |
| 5,654,237 A | 8/1997 | Suguro et al. |
| 5,694,355 A | 12/1997 | Skjaveland et al. |
| 5,696,036 A | 12/1997 | Su et al. |

(Continued)

OTHER PUBLICATIONS

Shukuri et al. "CMOS Process Compatible ie-Flash(inverse gate electrode Flash) Technology for System-on-a-Chip", IEEE 2001 Custom Integrated Circuits Conference, pp. 179-182.

(Continued)

*Primary Examiner* — Thanhha Pham
(74) *Attorney, Agent, or Firm* — Bever, Hoffman & Harms, LLP; E. Eric Hoffman

(57) ABSTRACT

A non-volatile memory cell with increased charge retention is fabricated on the same substrate as logic devices using a single-gate conventional logic process. A silicide-blocking dielectric structure is formed over a floating gate of the NVM cell, thereby preventing silicide formation over the floating gate, while allowing silicide formation over the logic devices. Silicide spiking and bridging are prevented in the NVM cell, as silicide-blocking dielectric structure prevents silicide metal from coming in contact with the floating gate or adjacent sidewall spacers. The silicide-blocking dielectric layer may expose portions of the active regions of the NVM cell, away from the floating gate and adjacent sidewall spacers, thereby enabling silicide formation on these portions. Alternately, the silicide-blocking dielectric layer may cover the active regions of the NVM cell during silicide formation. In this case, silicide-blocking dielectric layer may be thinned or removed after silicide formation.

29 Claims, 21 Drawing Sheets

U.S. PATENT DOCUMENTS

| | | | |
|---|---|---|---|
| 5,699,297 | A | 12/1997 | Yamazaki et al. |
| 5,700,708 | A | 12/1997 | Chen et al. |
| 5,723,355 | A | 3/1998 | Chang et al. |
| 5,736,764 | A | 4/1998 | Chang |
| 5,736,765 | A | 4/1998 | Oh et al. |
| 5,761,126 | A | 6/1998 | Chi et al. |
| 5,783,470 | A | 7/1998 | Rostoker |
| 5,879,990 | A | 3/1999 | Dormans et al. |
| 5,940,324 | A | 8/1999 | Chi et al. |
| 5,953,255 | A | 9/1999 | Lee |
| 6,017,792 | A | 1/2000 | Sharma et al. |
| 6,060,403 | A | 5/2000 | Yasuda et al. |
| 6,064,107 | A | 5/2000 | Yeh et al. |
| 6,064,595 | A | 5/2000 | Logie et al. |
| 6,102,963 | A | 8/2000 | Agrawal |
| 6,145,069 | A | 11/2000 | Dye |
| 6,180,453 | B1 | 1/2001 | Sung et al. |
| 6,218,234 | B1 | 4/2001 | Yu et al. |
| 6,221,007 | B1 | 4/2001 | Green |
| 6,232,631 | B1 | 5/2001 | Schmidt et al. |
| 6,256,248 | B1 | 7/2001 | Leung |
| 6,278,159 | B1 | 8/2001 | Patelmo et al. |
| 6,282,123 | B1 | 8/2001 | Mehta |
| 6,329,240 | B1 | 12/2001 | Hsu et al. |
| 6,415,353 | B1 | 7/2002 | Leung |
| 6,449,685 | B1 | 9/2002 | Leung |
| 6,504,780 | B2 | 1/2003 | Leung |
| 6,512,691 | B2 | 1/2003 | Hsu et al. |
| 6,548,355 | B2 | 4/2003 | Pio |
| 6,590,570 | B1 | 7/2003 | Maki |
| 6,803,299 | B2 | 10/2004 | Eitan |
| 6,898,140 | B2 | 5/2005 | Leung et al. |
| 6,977,408 | B1 | 12/2005 | Lin et al. |
| 7,200,038 | B2 | 4/2007 | Lee et al. |
| 7,257,033 | B2 | 8/2007 | Wang et al. |
| 7,447,064 | B1 | 11/2008 | Bu et al. |
| 2002/0015327 | A1 | 2/2002 | McPartland et al. |
| 2003/0032241 | A1 | 2/2003 | Seo et al. |
| 2004/0021166 | A1 | 2/2004 | Hyde et al. |
| 2005/0074935 | A1 | 4/2005 | Hsu |
| 2005/0173753 | A1 * | 8/2005 | Kim et al. ............... 257/315 |
| 2005/0281087 | A1 | 12/2005 | Shirota et al. |
| 2006/0186947 | A1 | 8/2006 | Lin et al. |

OTHER PUBLICATIONS

Takeshima et al. "A 3.3 V Single-Power-Supply 64Mb Flash Memory with Dynamic Bit-Line Latch (DBL) Programming Scheme", 1994 IEEE International Solid-State Circuits Conference, Digest of Technical Papers, pp. 148-149.

Houdt et al. "Analysis of the Enhanced Hot-Electron Injection in Split-Gate Transistors Useful for EEPROM Applications", IEEE Transactions on Electron Devices, vol. 39, No. 5, May 1992, pp. 1150-1156.

* cited by examiner

# METHOD TO INCREASE CHARGE RETENTION OF NON-VOLATILE MEMORY MANUFACTURED IN A SINGLE-GATE LOGIC PROCESS

CROSS REFERENCE TO RELATED APPLICATIONS

This is a divisional of U.S. patent application Ser. No. 11/341,881 filed Jan. 26, 2006, "Method To Increase Charge Retention Of Non-Volatile Memory Manufactured In A Single-Gate Logic Process" by Gang-feng Fang, Dennis Sinitsky and Wingyu Leung.

The present invention relates to non-volatile memory (NVM). More particularly, this invention relates to non-volatile memory cells fabricated using an ASIC or conventional logic process. In the present application, a conventional logic process is defined as a semiconductor process that implements single-well or twin-well technology and uses a single gate layer. This invention further relates to a method of operating a non-volatile memory to ensure maximum data retention time.

BACKGROUND OF INVENTION

Many modern integrated circuit applications demand the integration of non-volatile memory (NVM) and logic circuits on the same chip. However, traditional NVM cells are typically fabricated using a stacked gate structure or a split gate structure. Therefore, a typical NVM fabrication process requires the deposition of more than one gate layer. In contrast, logic circuits are typically fabricated using a semiconductor integrated circuit manufacturing process that involves the deposition of only one gate layer, which is deposited and patterned at the same time for all devices on the chip. Such a single-gate process is hereinafter referred to as a conventional logic process. Because the single-gate layer used in a conventional logic process typically includes polysilicon, this process is sometimes referred to as a single-poly process.

The different requirements of traditional NVM circuits and logic circuits makes it difficult to fabricate both of these circuits on the same chip. The combination of an NVM circuit and a conventional logic circuit therefore typically requires the use of a much more complicated and expensive "merged non-volatile memory and logic" process, and results in a high wafer price.

In order to resolve the NVM process integration challenge, various types of planar CMOS NVM structures have been proposed. Such NVM structures incorporate the single gate layer of the conventional logic process. More specifically, these NVM structures use patterned sections of the gate layer, which are left floating (i.e., have no associated gate contact, and are isolated from the substrate by a gate dielectric layer). These floating gates are selectively programmed or erased to store predetermined charges. Each floating gate passes over a respective read device (i.e., read transistor), whereby the charge stored on each floating gate alters the conduction properties of the associated read device. These conduction properties are sensed during the read operation. It is therefore essential that the charge stored on a floating gate manufactured in a conventional logic process is retained for as long as possible, thereby increasing the data retention time of the NVM system.

FIG. 1 is a cross-sectional view of a conventional NVM cell 100 fabricated using a conventional logic process. NVM cell 100 is fabricated in substrate 101 and is isolated from other devices by field dielectric region 114. In a conventional logic process, field dielectric region 114 may be formed by filling a pre-etched substrate trench with dielectric, thereby forming a shallow-trench isolation (STI) region. NVM cell 100 includes source and drain contact diffusions 131 and 132, respectively, associated lightly doped source and drain extension diffusions 131A and 132A, gate dielectric layer 115, polysilicon floating gate 116, metal silicide regions 141-143 and dielectric sidewall spacers 105-106. Gate dielectric layer 115 (which is typically silicon dioxide) isolates floating gate 116 (which is typically heavily-doped poly-silicon) from substrate 101. Silicide regions 141, 142 and 143 are formed on the exposed upper surfaces of source contact region 131, drain contact region 132 and floating gate 116, respectively. Silicide regions 141-143 are formed in the following manner. A refractory metal layer is initially deposited over the upper surface of the NVM cell structure. Then, a reactive anneal is performed, which causes the metal layer to react with the underlying contacted silicon regions to form silicide regions 141-143. Next, a metal strip is performed, wherein the unreacted portions of the metal layer are removed, but silicide regions 141, 142, and 143 are not removed. Because silicide regions 141-143 are self-aligned with the underlying silicon regions, these layers are sometimes referred to as salicide (self-aligned silicide) regions. Modern logic processes use metals such as titanium (Ti), cobalt (Co), and nickel (Ni) to form silicide regions. The resulting silicides are attractive because of their ability to maintain low resistivity in narrow diffusion and polysilicon gate lines, which are used in advanced processes.

However, the metal layer used to form silicide regions 141-143 may undesirably react with silicon dioxide present in dielectric sidewall spacers 105-106 during the silicide formation process. This problem, which is commonly referred to as bridging, can result in the formation of conductive (silicide or metal) residue regions 144A-144B, which can short floating gate 116 to the source and drain diffusion regions 131-132, thereby creating a leakage path for charge to drain from floating gate 116.

The integrity of gate dielectric layer 115 is another concern associated with the formation of gate silicide region 143. Gate silicide region 143 can spike through floating gate 116, as illustrated by silicide spike 145 of FIG. 1. Silicide spike 145 degrades the performance of gate dielectric layer 115, and can potentially penetrate through gate dielectric layer 115 into silicon substrate 101, thereby causing a resistive short between floating gate 116 and substrate 101. In general, silicide spiking events are rare and result in minor local degradation of gate dielectric quality or a small gate dielectric leakage increase for an entire chip that contains many millions of transistors. It is, however, critical to eliminate spiking events in gate dielectric layers that are used in NVM cells, in order to preserve long floating gate charge retention for all bits in the NVM memory. Silicide spiking events are expected to get worse as gate thickness scales in advanced process generations and as industry migrates to fully-silicided (FUSI) gates.

The problems introduced by NVM cell 100 are described in more detail in the following references: [1] Ken-ichi et al., "A New Leakage Mechanism of Co Silicide and Optimized Process Conditions", IEEE Transactions on Electron Devices, Vol. 4, No. 1, January 1999, pp. 117-124; and [2] S. Wolf, "Silicon Processing for the VLSI Era Volume 4—Deep-Submicron Process Technology", Lattice Press, 2002, pp. 603-634.

It would therefore be desirable to have a NVM cell that can be fabricated without modifying a conventional logic process (or requiring minimal modifications to a conventional logic process), and is not susceptible to silicide spiking and silicide bridging.

SUMMARY

Accordingly, the present invention provides a non-volatile memory cell, which does not exhibit spiking or bridging, and is fabricated on the same substrate as conventional logic devices, in accordance with a conventional logic process.

In one embodiment, the NVM cell includes an access transistor having active regions located in a semiconductor substrate, and a capacitor structure having an active region located in the semiconductor substrate, wherein the access transistor and the capacitor structure share a common polysilicon floating gate. Dielectric sidewall spacers are formed around the floating gate.

A silicide-blocking dielectric structure is formed over the floating gate and the sidewall spacers prior to silicide formation. In accordance with one embodiment, portions of the active regions of the access transistor and the capacitor, which are spaced away from the sidewall spacers, are exposed by the silicide-blocking dielectric structure. Silicide regions are then simultaneously formed on the exposed portions of the active regions of the NVM cell and on the desired regions of the logic devices.

In one embodiment, the silicide-blocking dielectric structure covers the entire floating gate. In another embodiment, the silicide-blocking dielectric structure can expose a section of the floating gate located over shallow trench isolation areas, such that silicide is formed over this exposed section of the floating gate.

In accordance with another aspect of the invention, the silicide-blocking dielectric structure may be formed such that the silicide regions formed on the active regions of the NVM cell are separated from the edges of these active regions. This advantageously minimizes the diffusion of metallic particles from these silicide regions through the field dielectric.

In another embodiment of the present invention, the silicide-blocking dielectric structure is formed entirely over the NVM cell, thereby blocking silicide formation on the active regions of the NVM cell. After silicide formation has been performed for the logic devices, the silicide-blocking dielectric structure is etched, thereby thinning or removing this structure. A pre-metal dielectric layer is formed over the resulting structure, and a contact etch is performed to expose the active regions of the NVM cell and the silicided regions of the logic devices. Thinning (or removing) the silicide-blocking dielectric structure ensures that the contact etch associated with a conventional logic process will reliably expose the active regions of the NVM cell.

In another embodiment, the silicide-blocking dielectric structure is not thinned or removed. Instead, contact openings are formed in the pre-metal dielectric layer using a multi-etch procedure. In the multi-etch procedure, a partial etch is initially performed to create openings in the pre-metal dielectric layer. These openings are selectively formed only at locations overlying the active regions of the NVM cells. A conventional contact etch is then performed. This conventional contact etch extends the openings formed during the partial etch, thereby exposing the active regions of the NVM cell. The conventional contact etch also exposes the silicided regions of the logic devices.

The present invention will be more fully understood in view of the following description and drawings.

DETAILED DESCRIPTION

Figure 1:
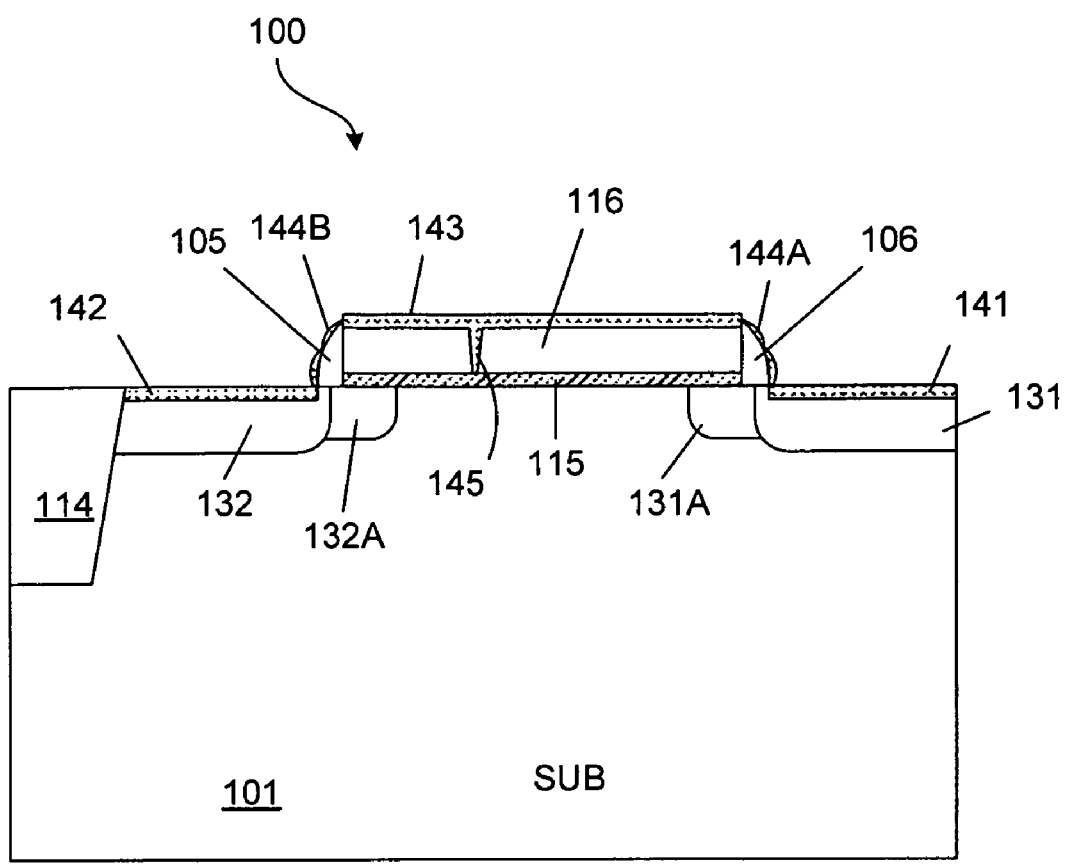
FIG. 1 is a cross-sectional view of a conventional non-volatile memory cell fabricated by a single-poly conventional logic process.
Figure 2:
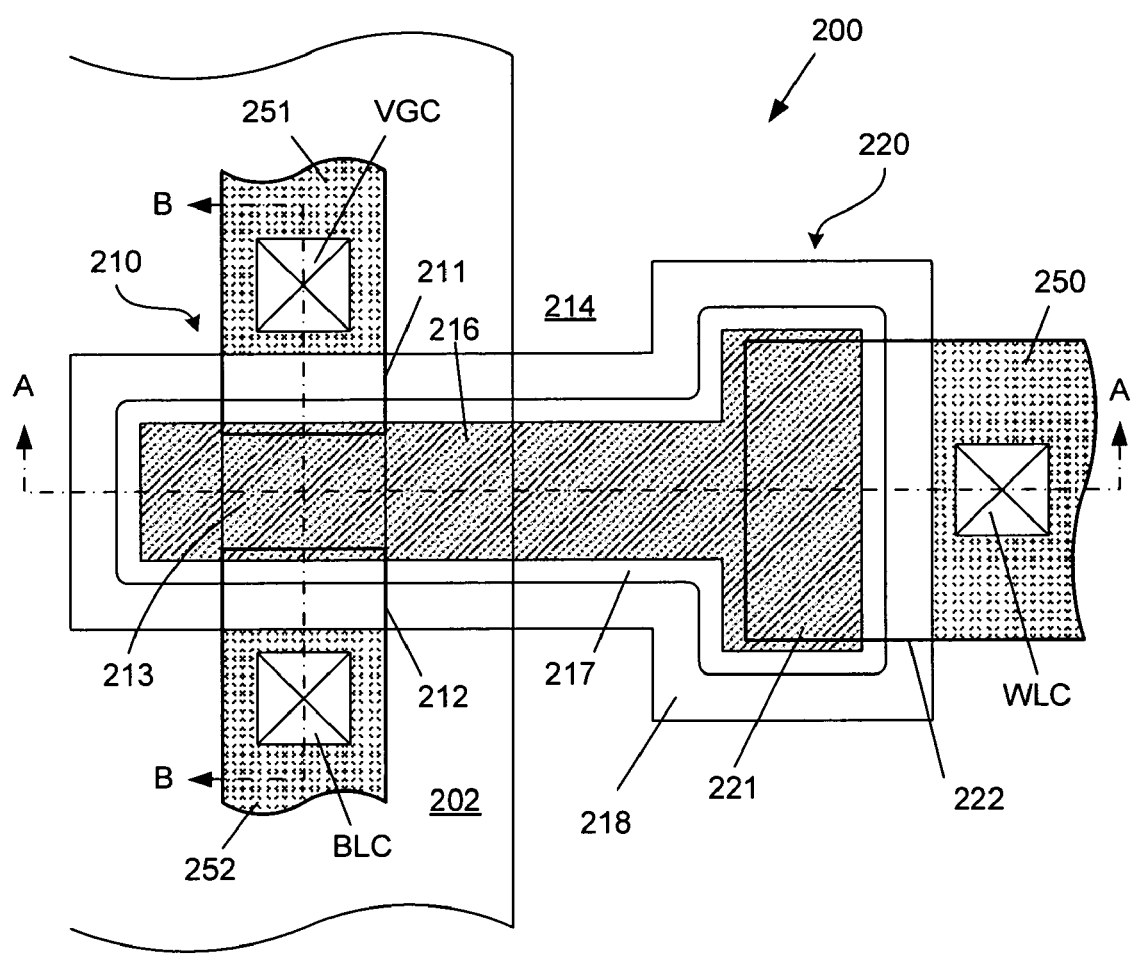
FIG. 2 is a top view of a non-volatile memory cell having a PMOS access transistor and an NMOS coupling capacitor in accordance with one embodiment of the present invention.
Figure 3A:
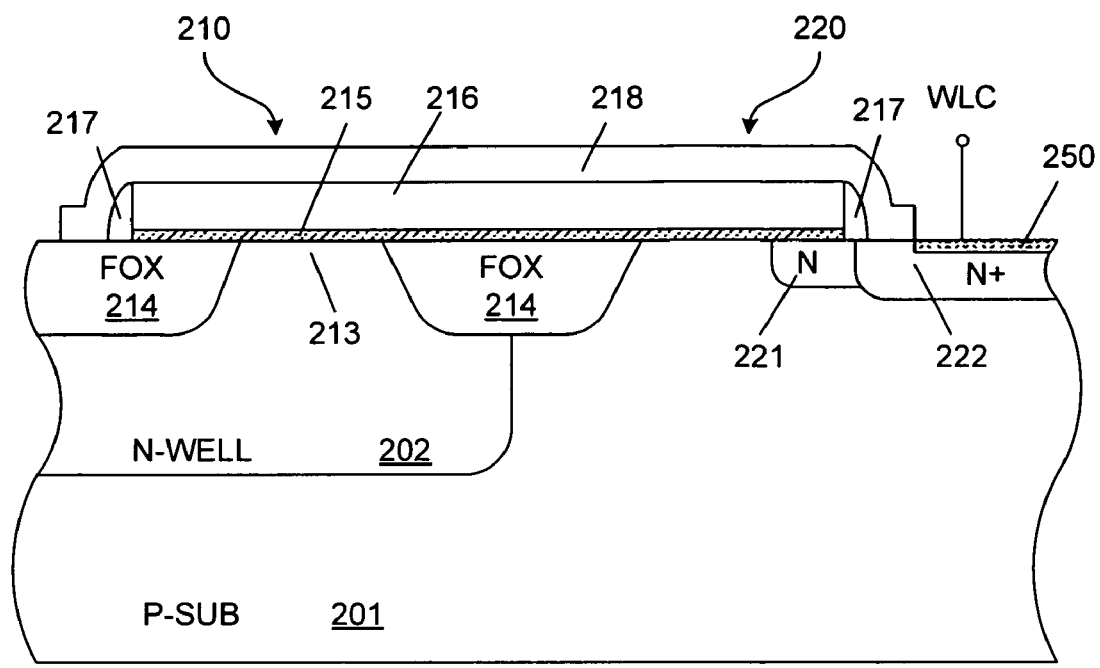
FIGS. 3A and 3B are cross-sectional views along section lines A-A and B-B, respectively, of FIG. 2.
Figure 3B:
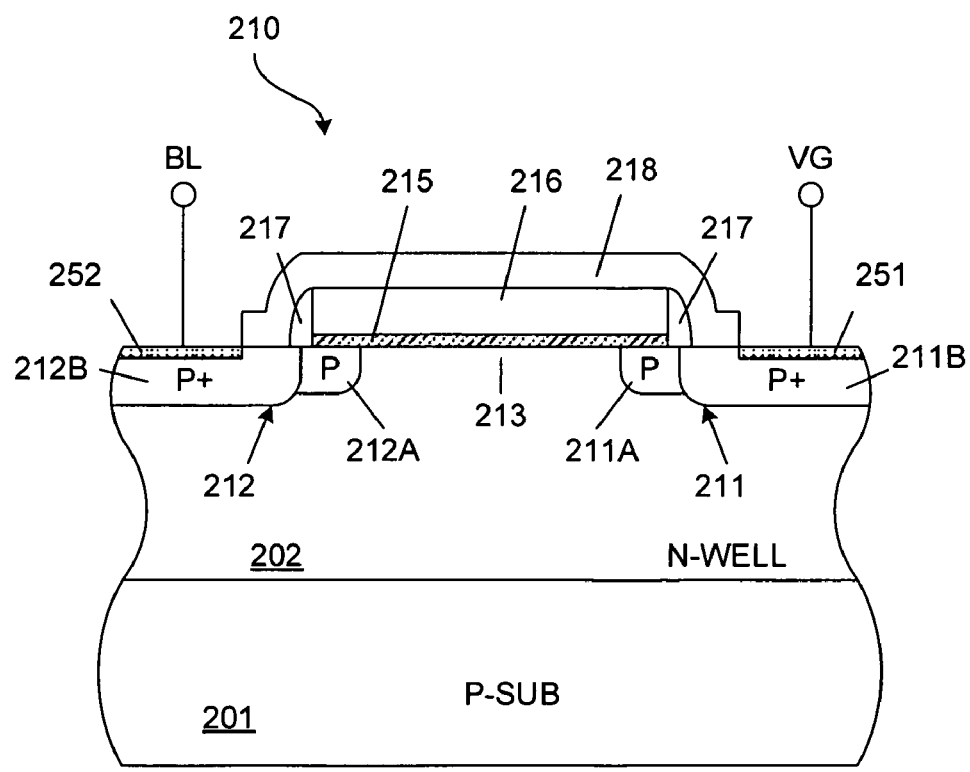

FIG. 2 is a top layout view of a non-volatile memory cell 200 in accordance with one embodiment of the present invention. FIG. 3A is a cross-sectional view of the non-volatile memory cell of FIG. 2 along section line A-A. FIG. 3B is a cross-sectional view of the non-volatile memory cell of FIG. 2 along section line B-B. Non-volatile memory cell 200 can be operated in response to a positive $V_{dd}$ supply voltage and a $V_{SS}$ supply voltage of 0 Volts.

Note that the general layout of non-volatile memory cell 200 is similar to the layout of the NVM cell described in commonly owned U.S. Pat. No. 6,512,691 (hereinafter, the '691 patent). The portions of the '691 patent which describe the fabrication and operation of common elements in the NVM cell 200 of the present invention and the NVM cell of the '691 patent are hereby incorporated by reference. Although the present invention is described using a specific NVM cell 200, it is understood that the present invention is in no way limited to the particular layout of non-volatile memory cell 200. As will become apparent in view of the following disclosure, the present invention can be applied to any planar CMOS floating single-polysilicon NVM cell.

Non-volatile memory cell 200 is fabricated in a p-type monocrystalline semiconductor substrate 201. In the described embodiment, substrate 201 is silicon. Non-volatile memory cell 200 includes a PMOS access transistor 210. Access transistor 210 includes p-type source region 211 and p-type drain region 212, which are formed in n-well region 202. Source region 211 includes lightly doped p-type source region 211A and p+ source contact region 211B. Drain region 212 includes lightly doped p-type drain region 212A and p+ drain contact region 212B. An n-type channel region 213 is located between source region 211 and drain region 212. Source silicide region 251 is formed on an upper surface of source contact region 211B. A virtual-ground contact (VGC) makes a low-resistance connection to source silicide region 251. Similarly, drain silicide region 252 is formed on an upper surface of drain contact region 212B. A bit line contact (BLC) makes a low-resistance connection to drain silicide region 252. Field dielectric 214 is located around source region 211, drain region 212 and channel region 213 as illustrated. Field dielectric 214 is planarized, such that the upper surface of field dielectric 214 and the upper surface of substrate 201 are located in the same plane. A thin gate dielectric layer 215, which is silicon oxide having a thickness between about 5 and 8 nm in the described example, is located over channel region 213. Gate dielectric layer 215 typically has the same thickness as the gate oxide layers used in the input/output (I/O) transistors of a conventional logic process (not shown) fabricated in substrate 201. A conductively doped polycrystalline silicon floating gate 216 is located over thin gate dielectric layer 215. The logic transistors fabricated in substrate 201 have control gate electrodes formed from the same polysilicon layer as floating gate 216. Sidewall spacer 217, which is typically formed from silicon nitride or silicon oxide, is located at the edges of floating gate 216.

Floating gate 216 and thin gate oxide 215 extend laterally beyond access transistor 210 over p-type substrate 201 and n-type coupling region 221. N-type coupling region 221 is coupled to n+ word line 222. N-type regions 221-222, gate oxide 215 and floating gate 216 form an NMOS capacitor structure 220. NMOS capacitor structure 220 couples word line 222 to floating gate 216. A capacitor silicide region 250 is formed on an upper surface of n+ diffusion word line 222. A word line contact (WLC) makes a low-resistance connection to capacitor silicide region 252.

Silicide-blocking structure 218 is located over floating gate 216 and sidewall spacers 217. Silicide-blocking structure 218 is available in a conventional logic process, because a silicide-blocking layer is normally used to prevent certain circuit elements, such as resistors, from becoming silicided. Silicide-blocking dielectric structure 218 is formed by blanket deposition of a silicide-blocking dielectric layer over the upper surface of the semiconductor structure after floating gate 216, sidewall spacers 217, p-type source region 211, p-type drain region 212, and n-type regions 221-222 have been formed, but before any silicide has been formed. In the described embodiment, the silicide-blocking dielectric layer is silicon dioxide, having a thickness between 100 Angstroms and 500 Angstroms. The silicide-blocking dielectric layer is then patterned and etched away from the diffusion regions where contacts are to be formed, and from the regions of the substrate where logic devices (e.g., logic transistors) are to be fabricated. Etching the silicide-blocking dielectric layer from the regions where logic devices are to be formed allows silicide to be formed on the desired regions (e.g., gates, drains and sources) of these logic devices. After the etch is complete, silicide-blocking dielectric structure 218 remains, covering polysilicon floating gate 216 and sidewall spacer 217.

A metal layer, such as titanium, cobalt, or nickel, (not shown) is then deposited over the resulting structure. A reactive anneal is then performed. During the reactive anneal, the portions of the metal layer that contact underlying silicon regions form metal silicide regions, including silicide regions 250, 251 and 252, which are formed over N+ word line region 222, P+ source contact region 211B and P+ drain contact region 212B. The unreacted portions of metal layer 245 are subsequently removed, leaving the silicide regions. Contacts, including contacts WLC, VGC and BLC, are subsequently formed, thereby providing electrical contacts to silicide regions, including silicide regions 250, 251 and 252, respectively.

In the above-describe manner, NVM cell 200 can be fabricated using a conventional logic process, without any process modifications or special implants.

Figure 4:
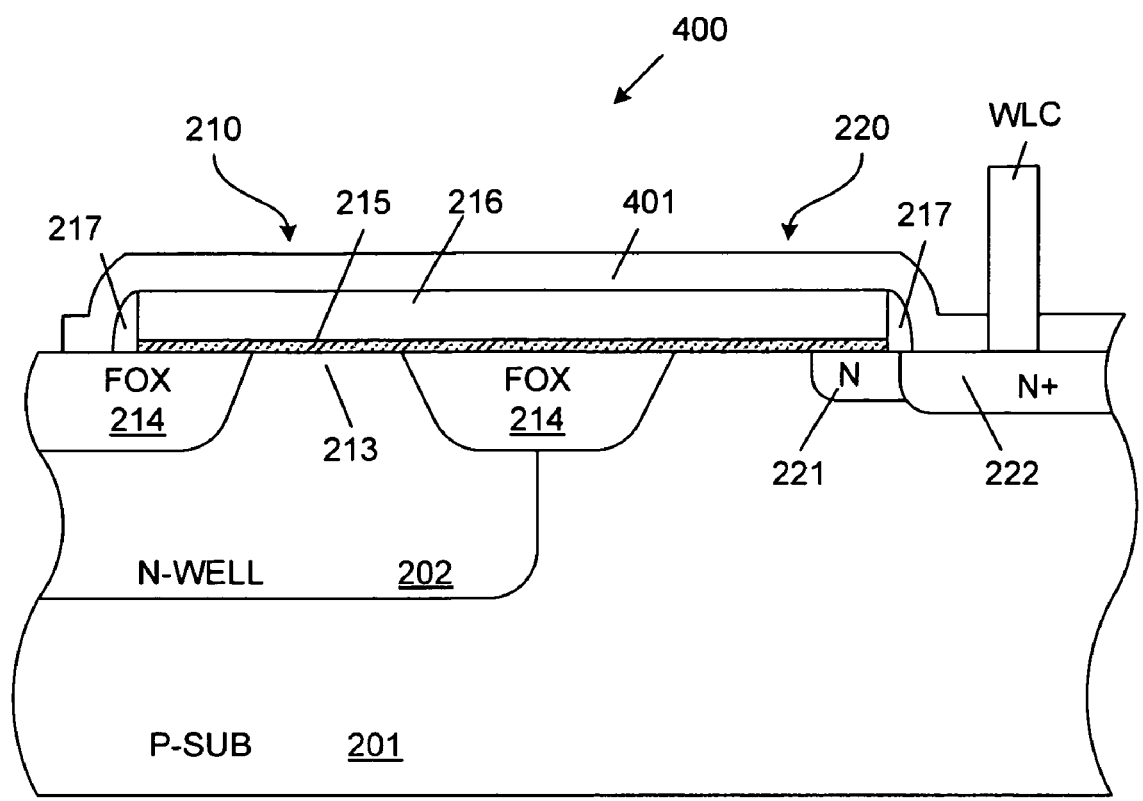
FIG. 4 is a cross-sectional view of an NVM cell, which does not include any silicide regions, in accordance with an alternate embodiment of the present invention.

FIG. 4 is a cross-sectional view of an NVM cell 400 in accordance with an alternate embodiment of the present invention. The portion of NVM cell 400 illustrated by FIG. 4 corresponds with the portion of NVM cell 200 illustrated by FIG. 3A. Because NVM cell 400 is similar to NVM cell 200, similar elements in FIGS. 3A and 4 are labeled with similar reference numbers. As illustrated in FIG. 4, a silicide-blocking dielectric region 401 covers both floating gate 216 and NVM cell diffusion regions 211, 212 and 222 during silicide formation, such that no silicide is formed on these diffusion regions 211, 212 and 222 or floating gate 216. Openings through silicide-blocking dielectric region 401 are subsequently formed, thereby allowing word line contact WLC to contact capacitor diffusion region 222 (shown), and allowing contacts VGC and BLC to contact their respective diffusion regions 211 and 212 (not shown). In this embodiment, it is essential that the contact etch etches completely through silicide-blocking dielectric region 401, so as to guarantee that the NVM cell contacts touch their respective diffusion regions. Layout methods for ensuring that NVM cell contacts touch their respective diffusion regions are described in connection with FIGS. 3, 5 and 6. Process methods for ensuring that the etch extends completely through silicide-blocking dielectric region 401 are described in more detail below, in connection with FIGS. 9, 10A-10E, 11, 12A-12E and 13.

Figure 5:
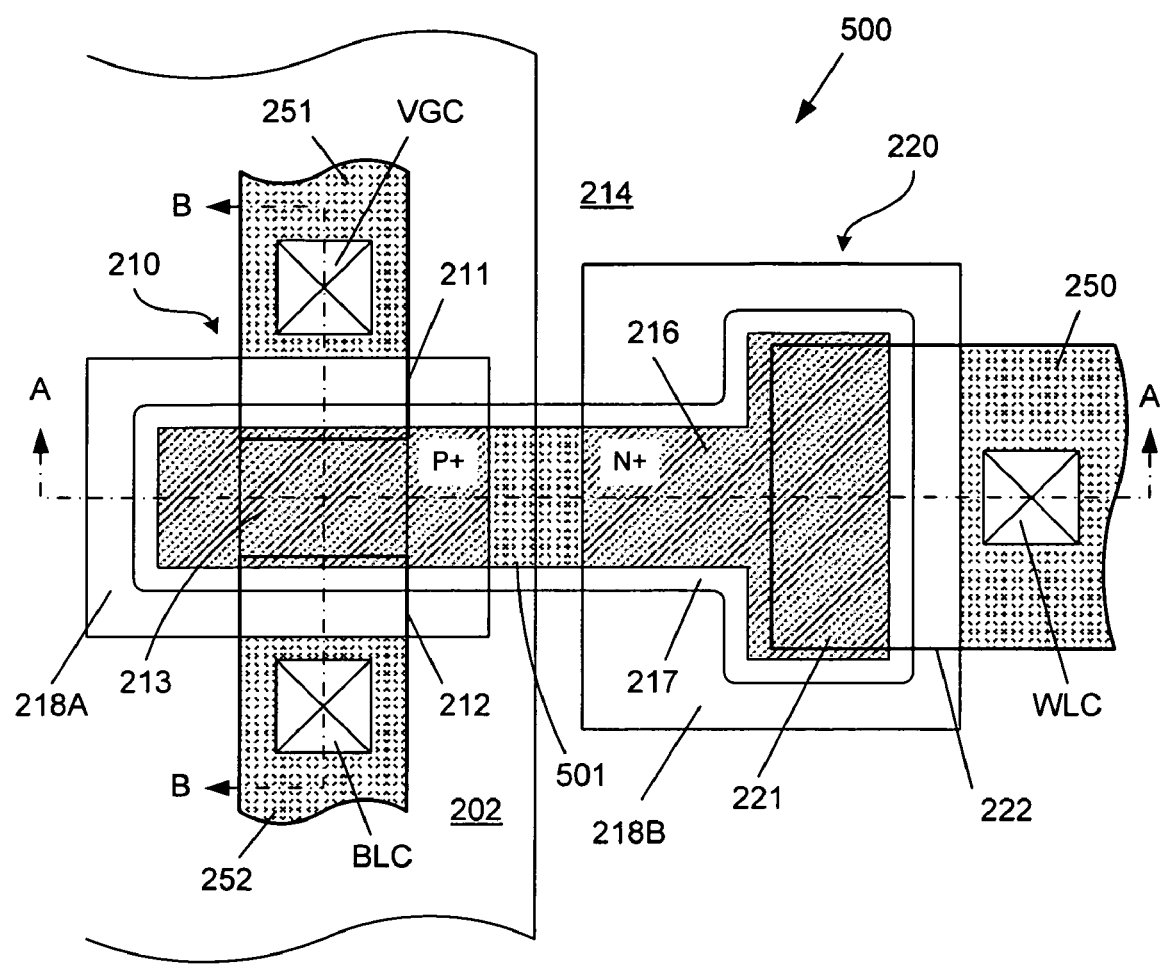
FIG. 5 is a top view of an NVM cell in accordance with yet another embodiment of the present invention, which includes a silicide region formed on a neutral portion of the floating gate.

FIG. 5 is a top view of an NVM cell 500 in accordance with another embodiment of the present invention. Because NVM cell 500 is substantially identical to NVM cell 200, similar elements in FIGS. 2 and 5 are labeled with similar reference numbers. The main difference between NVM cells 200 and 500 is that the silicide-blocking dielectric region 218 of NVM cell 200 is divided into two separate silicide-blocking dielectric regions 218A and 218B in NVM cell 500. The space between separate silicide-blocking dielectric regions 218A and 218B exposes a portion of gate electrode 216. Thus, during the silicidation step, a silicide region 501 is formed on this exposed portion of gate electrode 216. Silicide region 501 advantageously increases the conductivity of the central region of floating gate 216.

Note that the portion of floating gate 216 associated with access transistor 210 (and covered by silicide-blocking region 218A) is exposed during the P– and P+ implant steps. Similarly, the portion of floating electrode 216 associated with capacitor structure 220 (and covered by silicide-blocking region 218B) is exposed during the N– and N+ implant steps. Misalignment of the N-type and P-type implant masks, along with dopant cancellation, creates a neutral region in the area of the P-N junction of the floating gate 216 (i.e., the region where silicide region 501 is formed). This neutral region has a lower conductivity than the remainder of floating gate 216. Consequently, the location of silicide region 501 is selected to correspond with this neutral region, thereby providing a conductive path between the heavily doped P+ and N+ regions of floating gate 216.

It is important to note that silicide region 501 is located over field dielectric region 214, and not over an active region of the NVM cell 500. Thus, even if silicide region 501 spikes through floating gate 216, or bridges over sidewall spacer 217, there is no conductive path through which the charge on the floating gate 216 can leak away. That is, spiking or bridging will only allow silicide region 501 to contact the underlying field dielectric region 214. However, while the silicide-blocking regions may expose portions of the floating gate that extend over field dielectric region, those silicide-blocking regions at the same time cover the portions of the floating gate that extend over active regions of the NVM cell.

Figure 6:
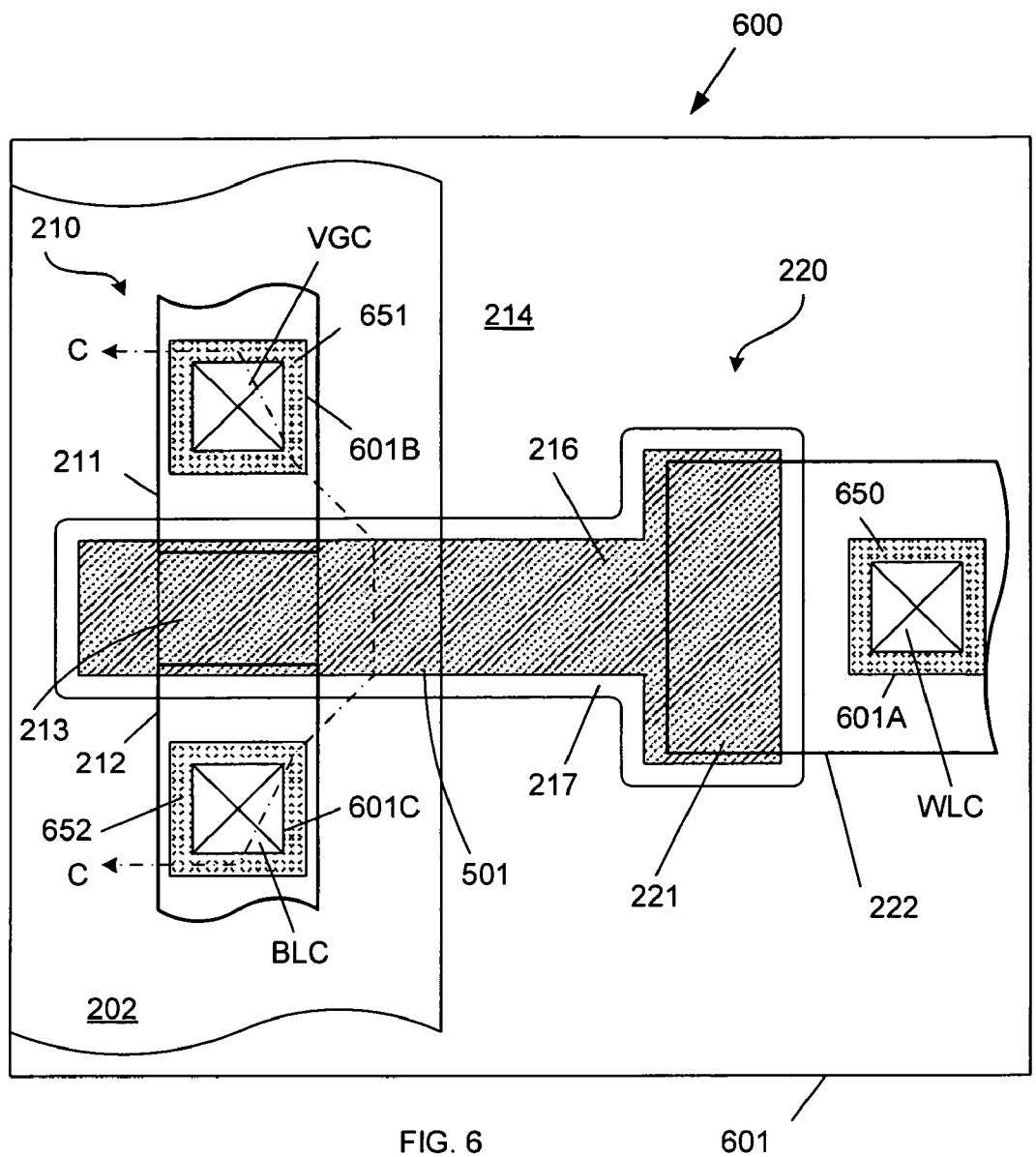
FIG. 6 is a top view of an NVM cell in accordance with another embodiment of the present invention, wherein silicide are formed away from edges of the NVM cell active regions.

FIG. 6 is a top view of an NVM cell 600 in accordance with another embodiment of the present invention. Because NVM cell 600 is substantially identical to NVM cell 200, similar elements in FIGS. 2 and 6 are labeled with similar reference numbers. The main difference between NVM cells 200 and 600 is that the NVM cell 600 uses a silicide-blocking dielectric region 601 that is laid out differently than the silicide-blocking dielectric region 218 of NVM cell 200. Silicide-blocking dielectric region 601 covers the entire NVM cell 600, except for the three locations where openings 601A, 601B and 601C are formed through the silicide-blocking dielectric region 601. Openings 601A, 601B and 601C expose the locations where silicide regions are to be formed in capacitor region 222, source region 211 and drain region 212, respectively. Silicide regions 650, 651 and 652 are formed through openings 601A, 601B and 601C, respectively. In accordance with the present embodiment, silicide regions 651-653 of NVM cell 600 are not in direct contact with the field dielectric region 214. That is, silicide regions 650, 651 and 652 are separated from field dielectric region 214 (and thereby the edges of the associated active regions) by thin sections of capacitor region 222, source region 211 and drain region 212, respectively. This structure advantageously minimizes the micro-diffusion of metallic particles from silicide regions 650-652 through field dielectric region 214. Such micro-diffusion may be a concern if the field dielectric region 214 is fabricated using an STI process, wherein the field oxide is not as dense as thermally-grown oxide, and is therefore susceptible to micro-diffusion.

Figure 7:
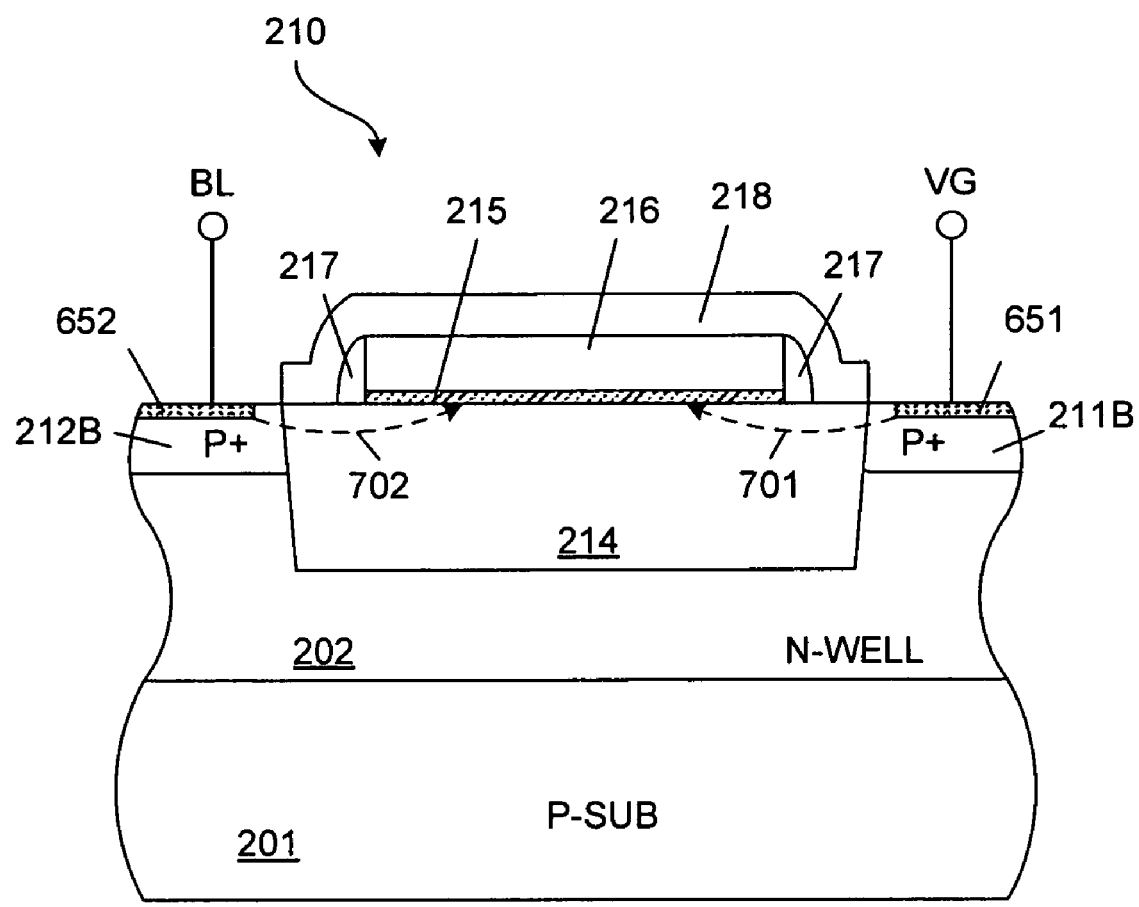
FIG. 7 is a cross-sectional view along section line C-C of FIG. 6.

FIG. 7 is a cross-sectional view along section line C-C of FIG. 6, which illustrates the above-described micro-diffusion issue in more detail. As shown in FIG. 7, metallic particles of silicide regions 651 and 652 could diffuse relatively easily along paths 701 and 702, respectively, but for the portions of source and drain regions 211 and 212, which separate silicide regions 651 and 652 from field dielectric region 214. Because metallic particles in silicide regions 651 and 652 do not diffuse easily through these portions of source and drain regions 211 and 212, there is no significant diffusion of metallic particles along paths 701 and 702. Note that if metallic particles were to diffuse from silicide regions 651 and 652 along paths 701 and 702, a resistive conduction path could be provided between floating gate 216 and silicide regions 651 and 652 along these paths 701-702, even though floating gate 216 and sidewall spacer 217 are protected by silicide-blocking dielectric region 601.

Note that forming openings 601A-601C in silicide-blocking region 601 may increase the NVM cell size, because openings 601A-601C may be relatively large, if formed using a conventional logic process. In a conventional logic process, the silicide-blocking structures are typically used to prevent the formation of silicide on large resistor structures. Consequently, the patterning of the silicide-blocking structures in a conventional logic process are typically only required to conform with design rules which are much less precise (and therefore larger) than the minimum design rules. If openings 601A-601C are patterned using the larger design rules, these openings will be relatively large, increasing the NVM cell size.

Figure 8:
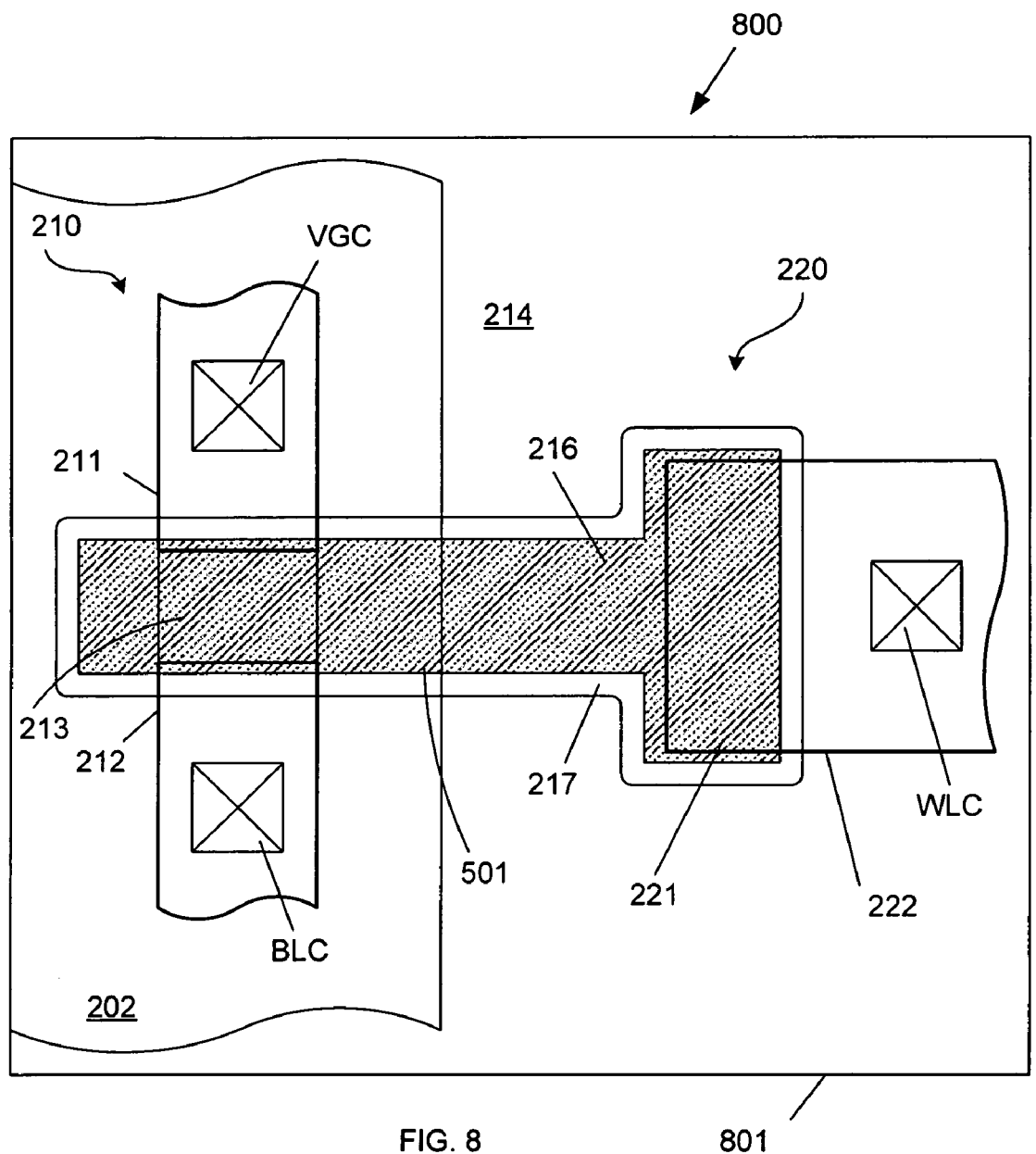
FIG. 8 is a top view of an NVM cell in accordance with another embodiment of the present invention, which does not require the formation of silicide regions on the active regions of the NVM cell.

FIG. 8 is a top view of an NVM cell 800, which is similar to NVM cell 600, but does not require forming openings 601A-601C or silicide regions 650-652. Because NVM cell 800 is similar to NVM cell 600, similar elements are labeled with similar reference numbers in FIGS. 6 and 8. NVM cell 800 includes a silicide-blocking dielectric structure 801, which covers the entire NVM cell 800. That is, silicide-blocking dielectric structure 801 does not include the openings 601A-601C found in silicide-blocking dielectric structure 601.

Figure 9:
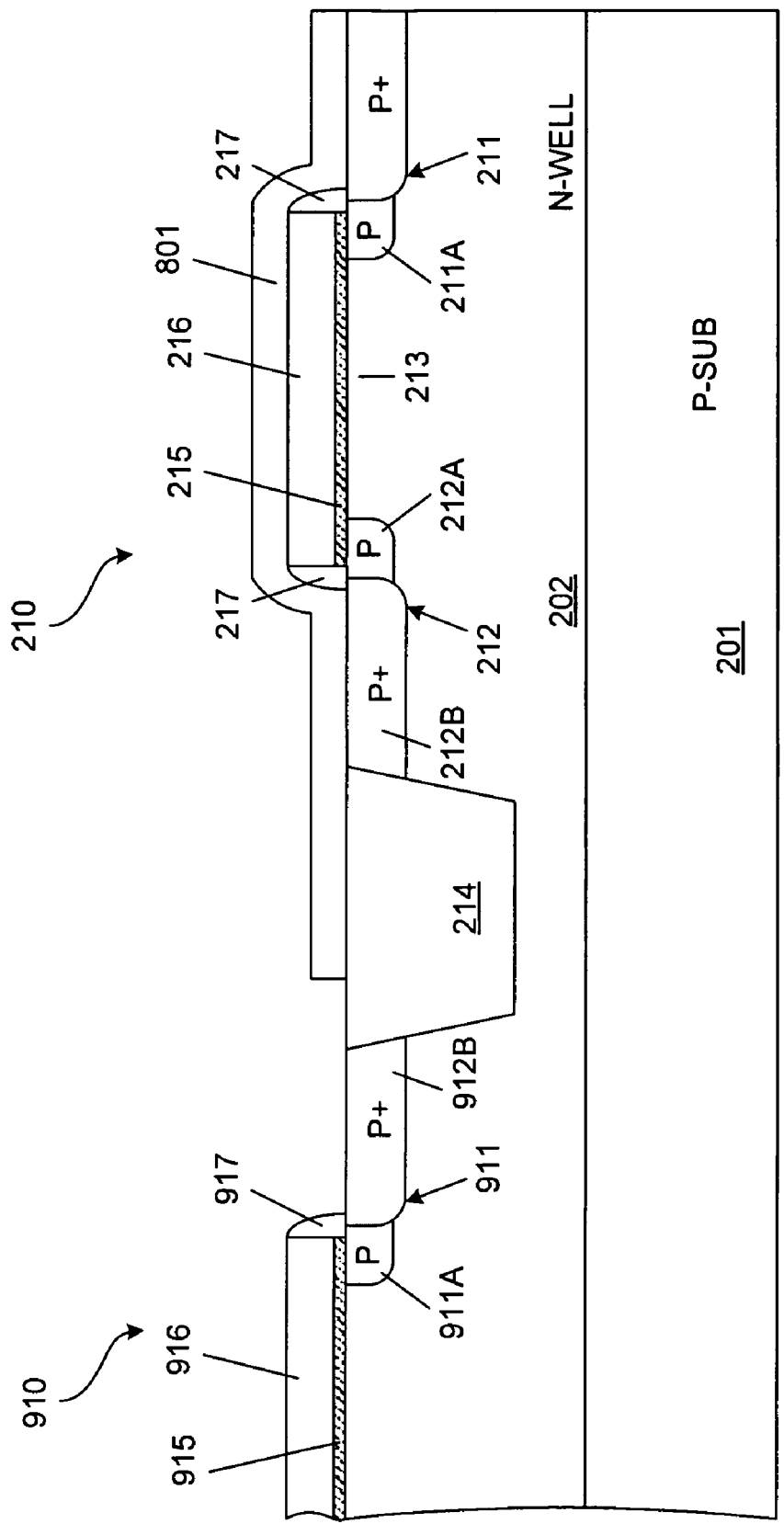
FIG. 9 is a cross-sectional view of the access transistor of the NVM cell of FIG. 8.

FIG. 9 is a cross-sectional view of the access transistor 210 of NVM cell 800 and a logic transistor 910, which are fabricated on the same substrate 201. The illustrated portion of logic transistor 910 includes p-type source region 911, gate dielectric layer 915, polysilicon control gate 916 and dielectric sidewall spacer 917. P-type source region 911 includes p-type source extension region 911A and P+ source contact region 911B. Silicide-blocking dielectric structure 801 extends over access transistor 210 and a portion of field dielectric region 214, but does not extend over logic transistor 910. A conventional contact etch will not reliably etch completely through silicide-blocking dielectric structure 801.

Figure 10A:
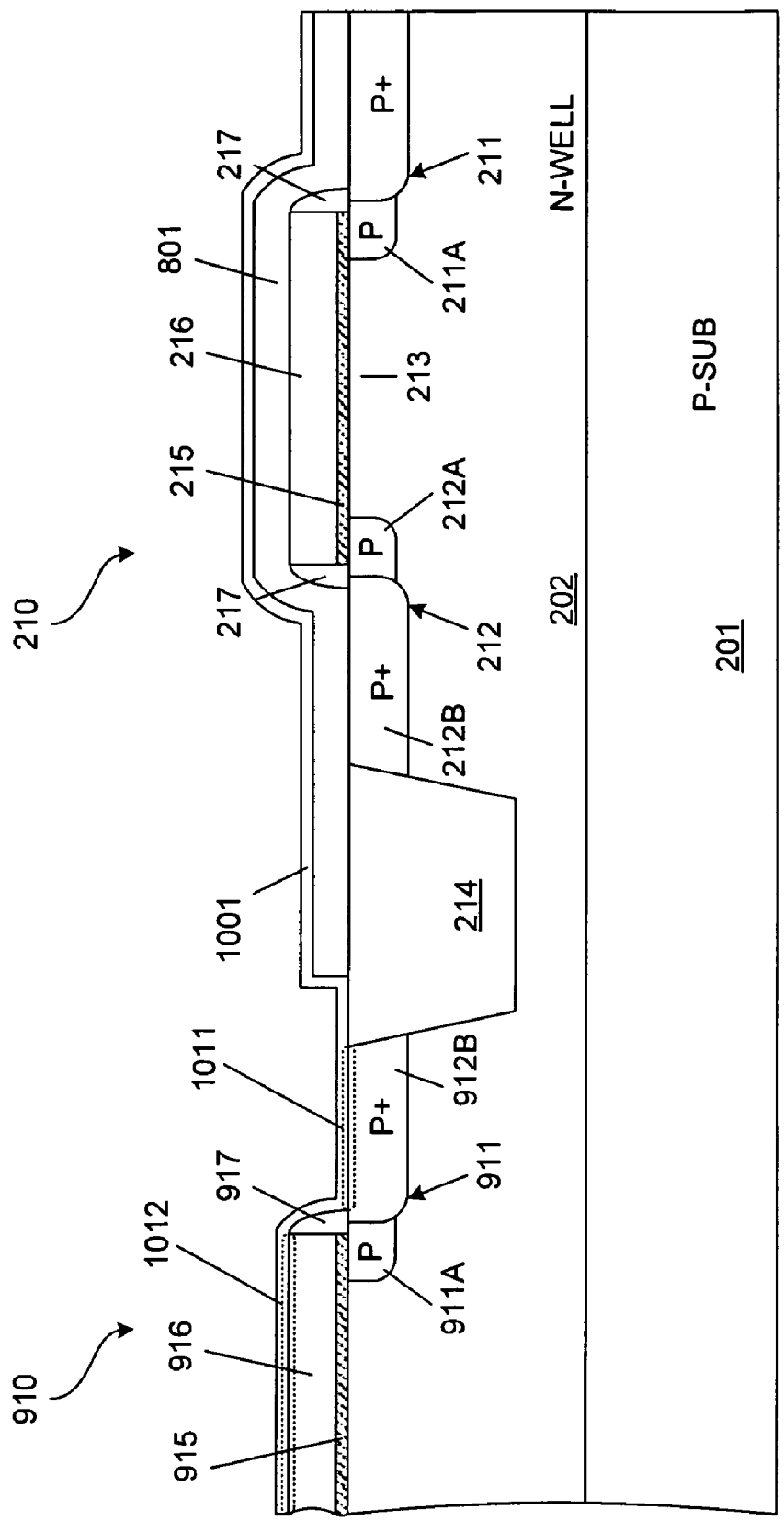
FIGS. 10A-10E are cross-sectional views illustrating a logic device and an access transistor of an NVM cell in accordance with one embodiment of the present invention, during various stages of fabrication.
Figure 10B:
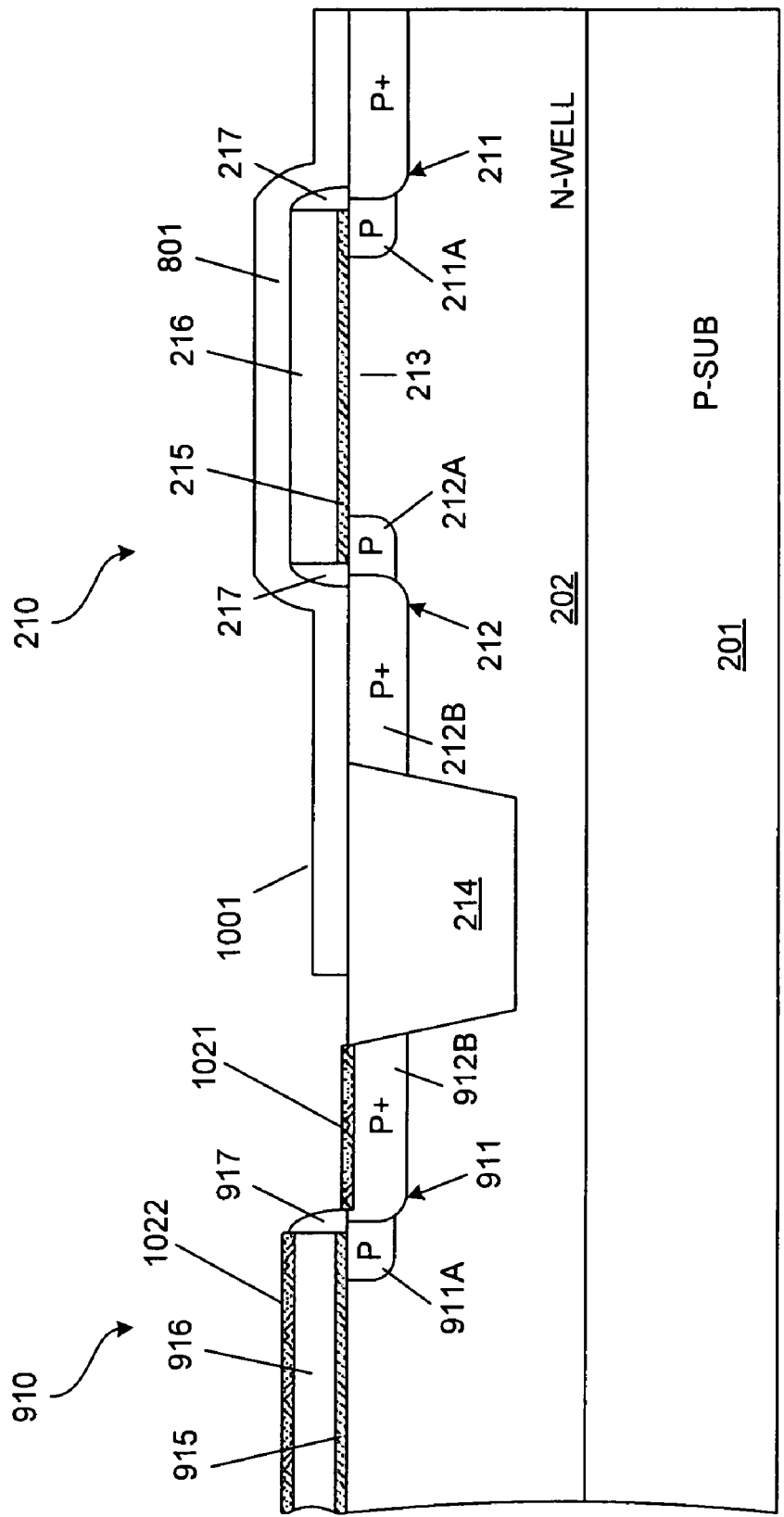

FIG. 10A is a cross-sectional view of access transistor 210 and logic transistor 910, after a metal layer 1001 (e.g., titanium, cobalt, nickel) has been deposited over the structure of FIG. 9. After metal layer 1001 has been deposited, an anneal is performed, such that silicide is formed in the regions 1011-1012 where metal layer 1001 contacts underlying silicon. The unreacted portions of metal layer 1001 are then removed, leaving silicide regions 1021 and 1022 as illustrated in FIG. 10B.

Figure 10C:
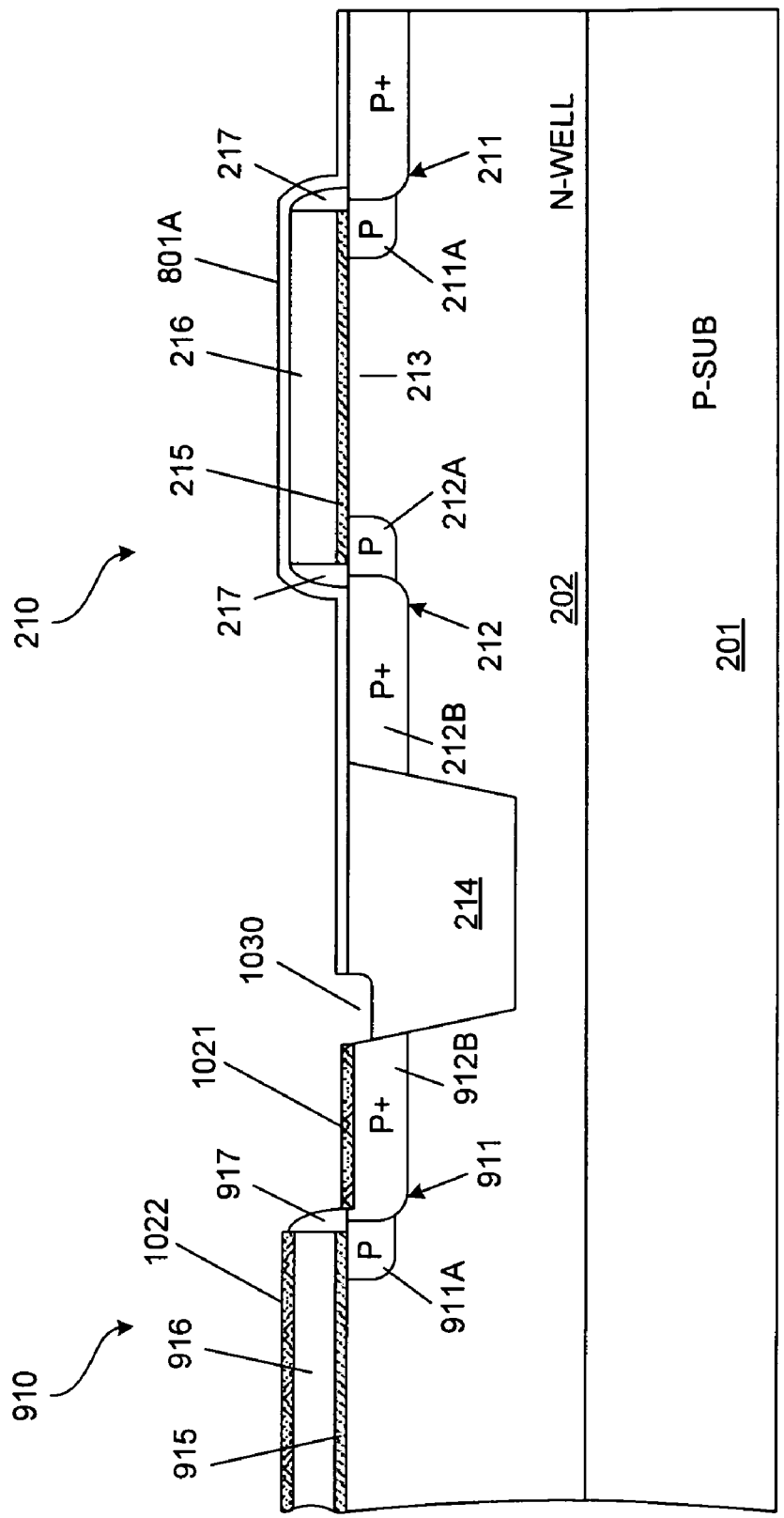

As illustrated in FIG. 10C, an etch is then performed to thin silicide-blocking dielectric structure 801, thereby creating thinned silicide-blocking dielectric structure 801A. Alternately, silicide-blocking dielectric structure 801 can be completely removed by this etch. Note that exposed portions of field dielectric region 214 may be etched during this step, as illustrated by etched region 1030.

Figure 10D:
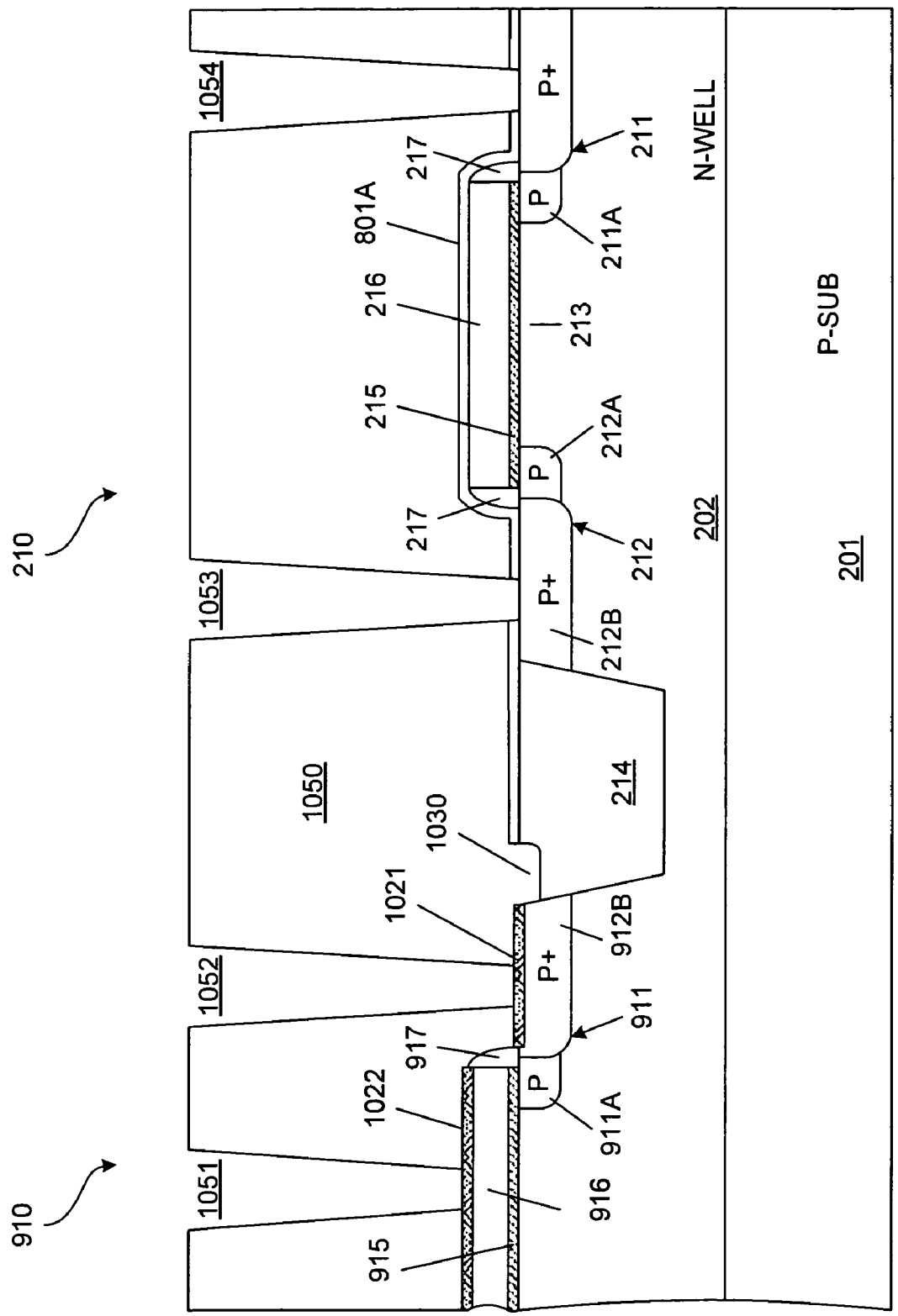

As illustrated in FIG. 10D, a pre-metal dielectric layer 1050 is formed over the structure of FIG. 10C. A contact etch is then performed in accordance with the conventional logic process, thereby forming openings 1051-1054 in pre-metal dielectric layer 1050. Openings 1051-5054 expose silicide region 1022 on control gate 916, silicide region 1021 on source contact region 911, drain contact region 212 and source contact region 211, respectively. The reduced thickness of thinned silicide-blocking dielectric structure 801A ensures that the conventional contact etch reliably exposes non-silicided diffusion regions 211 and 212. Note that pre-metal dielectric layer 1050 fills etched region 1030.

Figure 10E:
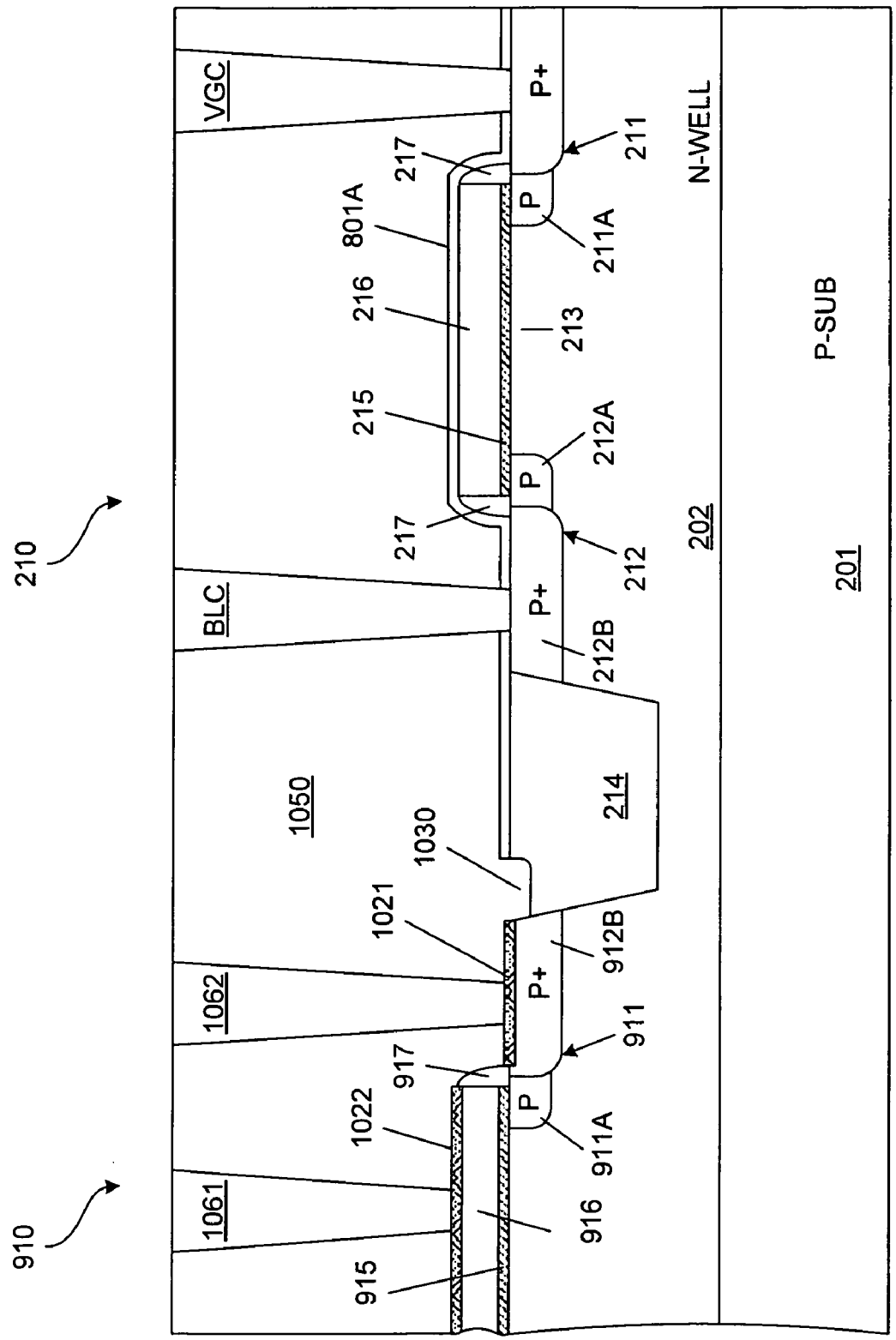

As illustrated in FIG. 10E, electrically conductive contacts 1061, 1062, BLC and VGC are formed in openings 1051-1054, respectively, thereby making contact to silicide region 1022, silicide region 1021, P+ drain contact region 212 and P+ source contact region, respectively.

Figure 11:
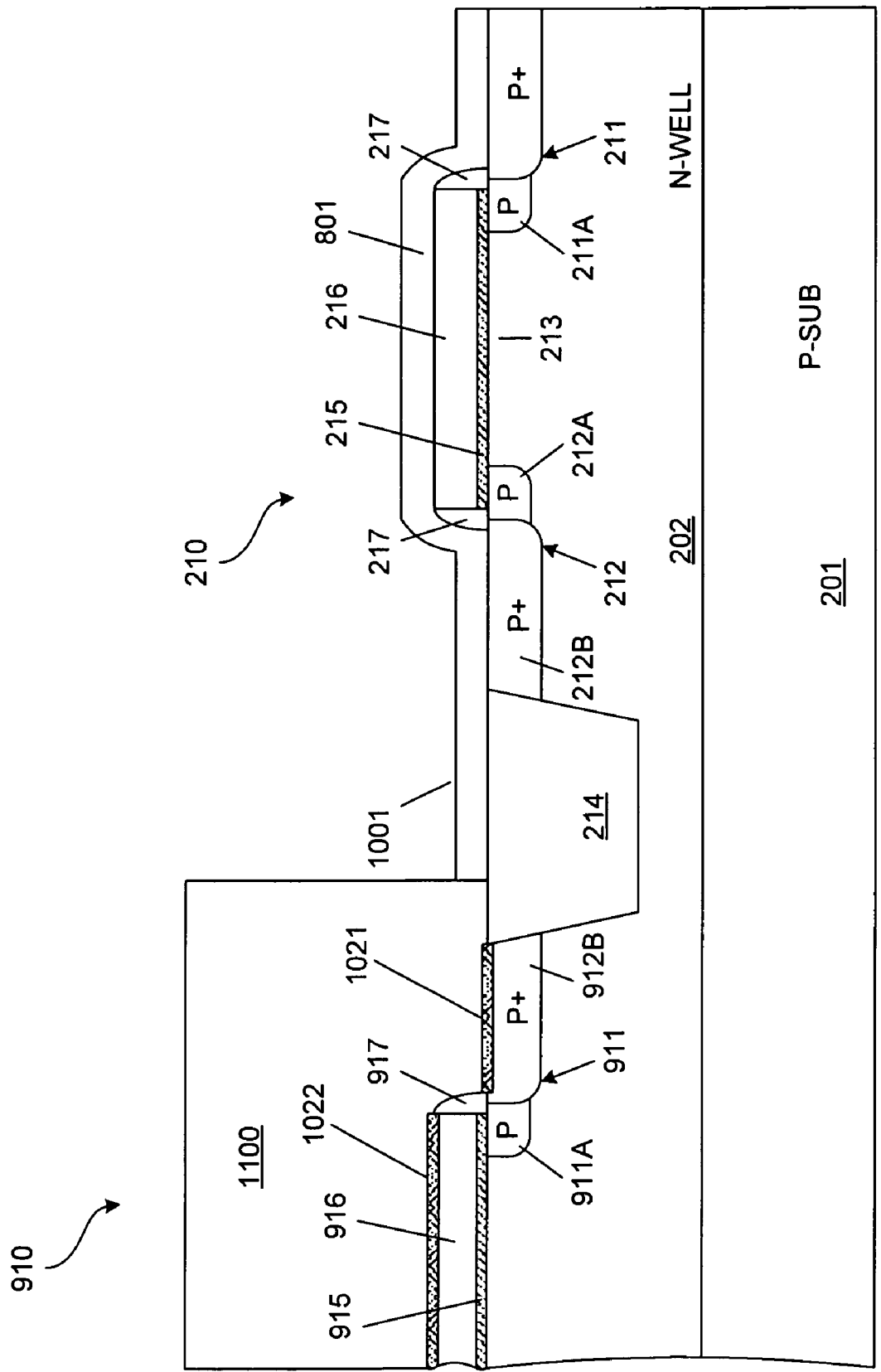
FIG. 11 is a cross-sectional view of a logic device and an access transistor of an NVM cell, which illustrates a variation of the embodiment of FIGS. 10A-10E.

FIG. 11 is a cross-sectional view of access transistor 210 and logic transistor 910, which illustrates a variation of the embodiment of FIGS. 10A-10E. In FIG. 11, a photoresist mask 1100 is formed over the structure illustrated in FIG. 10B. Photoresist mask 1100 requires an additional masking step not usually found in a conventional logic process. The silicide regions 1021-1022 (and the other silicided regions in the logic devices) are covered by photoresist mask 1100. Other logic devices (e.g., resistors), which are covered by silicide-blocking dielectric structures (not shown), may also be covered by photoresist mask 1100. An opening in photoresist mask 1100 exposes the NVM cells, including silicide-blocking dielectric structure 801. Silicide-blocking dielectric structure 801 is etched through the openings in photoresist mask 1100, thereby thinning (or removing) this structure in the manner described above in connection with FIG. 10C. Photoresist mask 1100 is then stripped, and processing continues as described above in connection with FIGS. 10C-10E. Note that etched region 1030 does not exist in the embodiment illustrated by FIG. 11.

Figure 12A:
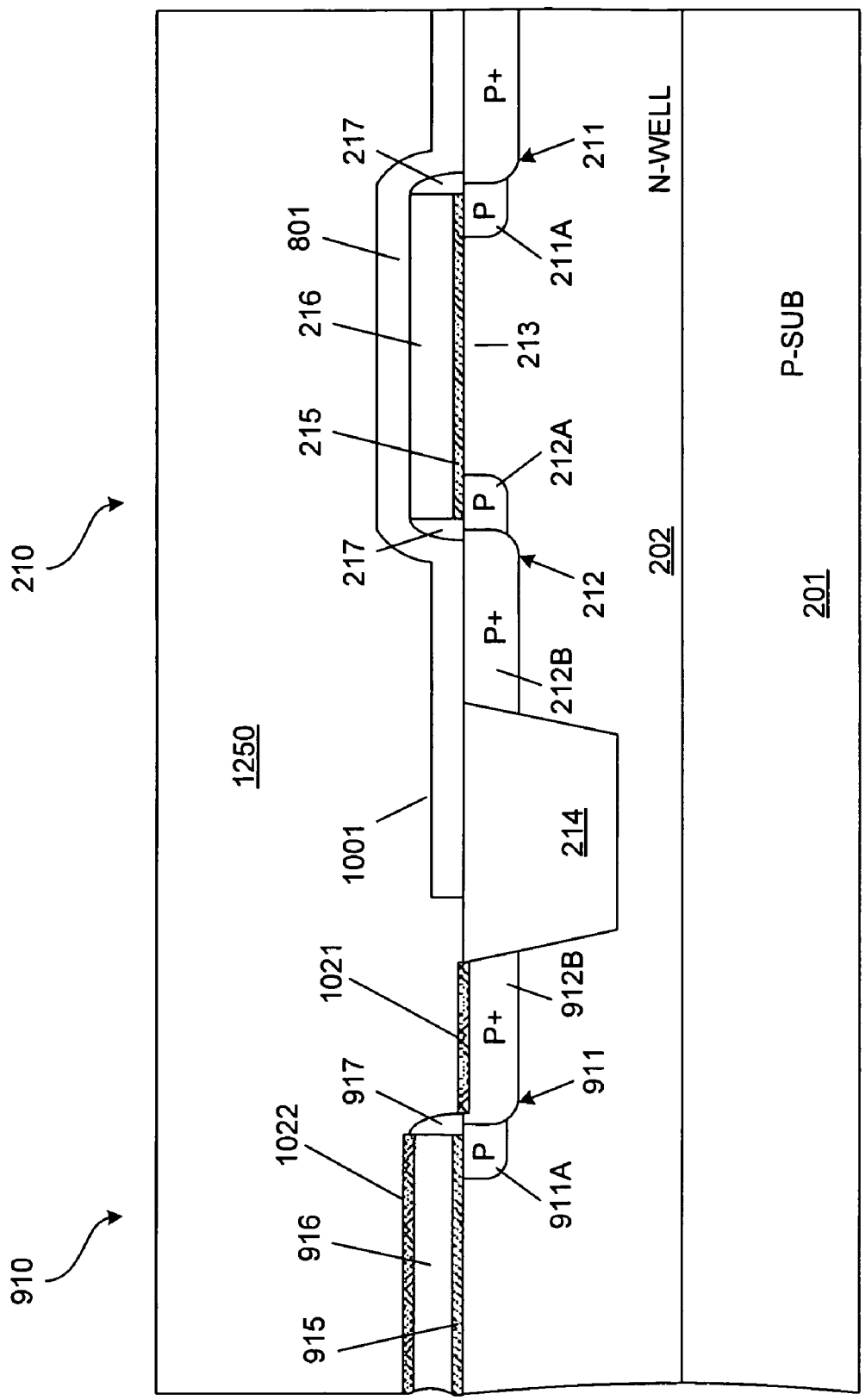
FIGS. 12A-12E are cross-sectional views illustrating a logic device and an access transistor of an NVM cell in accordance with another embodiment of the present invention, during various stages of fabrication.

FIG. 12A is a cross-sectional view of access transistor 210 and logic transistor 910 in accordance with yet another embodiment of the present invention. In this embodiment, pre-metal dielectric structure 1250 is formed over the structure illustrated in FIG. 10B. That is, pre-metal dielectric structure 1250 is formed without thinning (or removing) silicide-blocking dielectric structure 801.

Figure 12B:
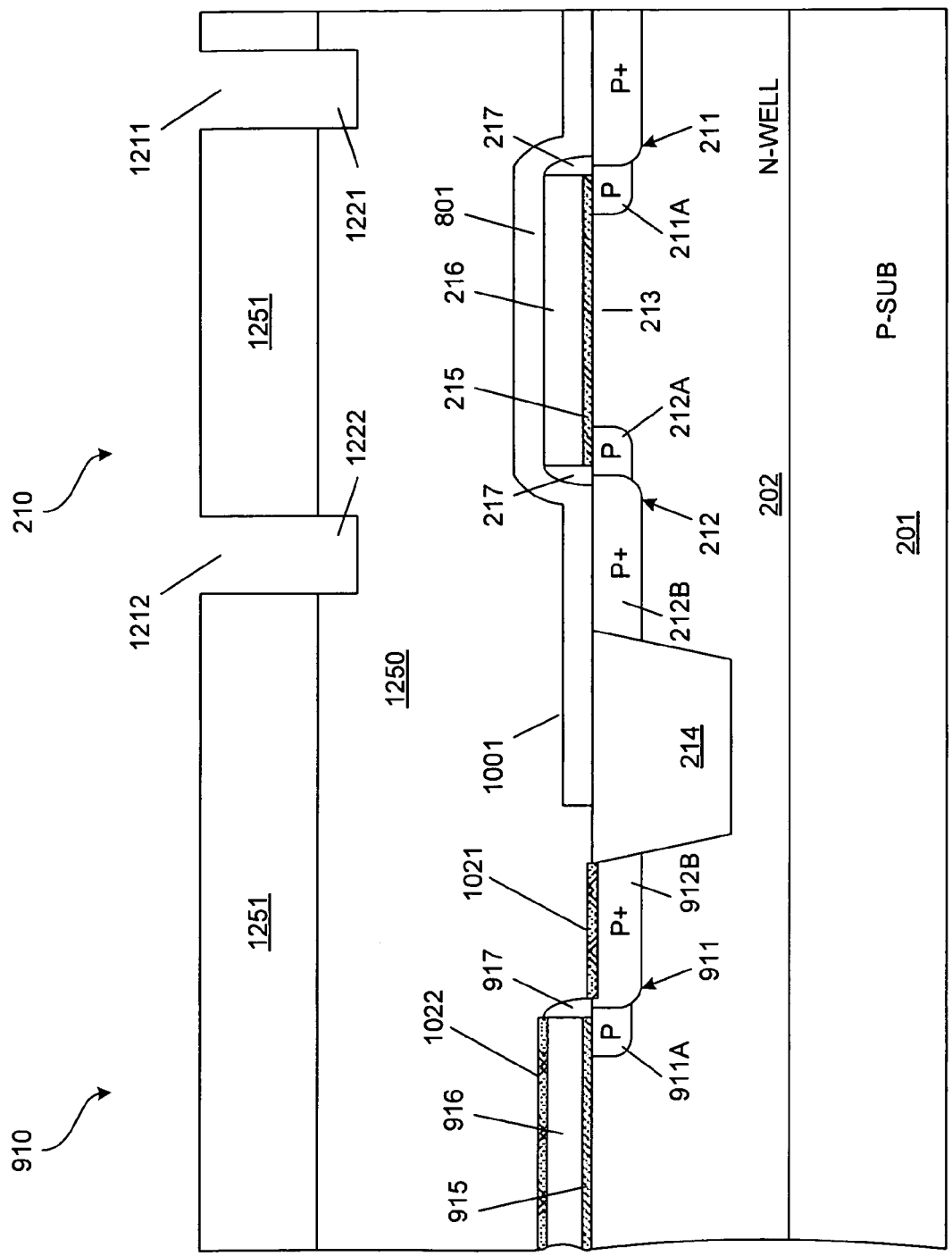

Photoresist layer 1251 is formed over pre-metal dielectric structure 1250, as illustrated in FIG. 12B. Photoresist 1251 is exposed and developed to form openings 1211 and 1212, which define the locations where contacts of NVM cells are to be formed. A partial etch is performed through openings 1211 and 1212, thereby forming etched regions 1221 and 1222 in the upper surface of pre-metal dielectric structure 1250. This partial etch represents a step in addition to a conventional logic process.

Figure 12C:
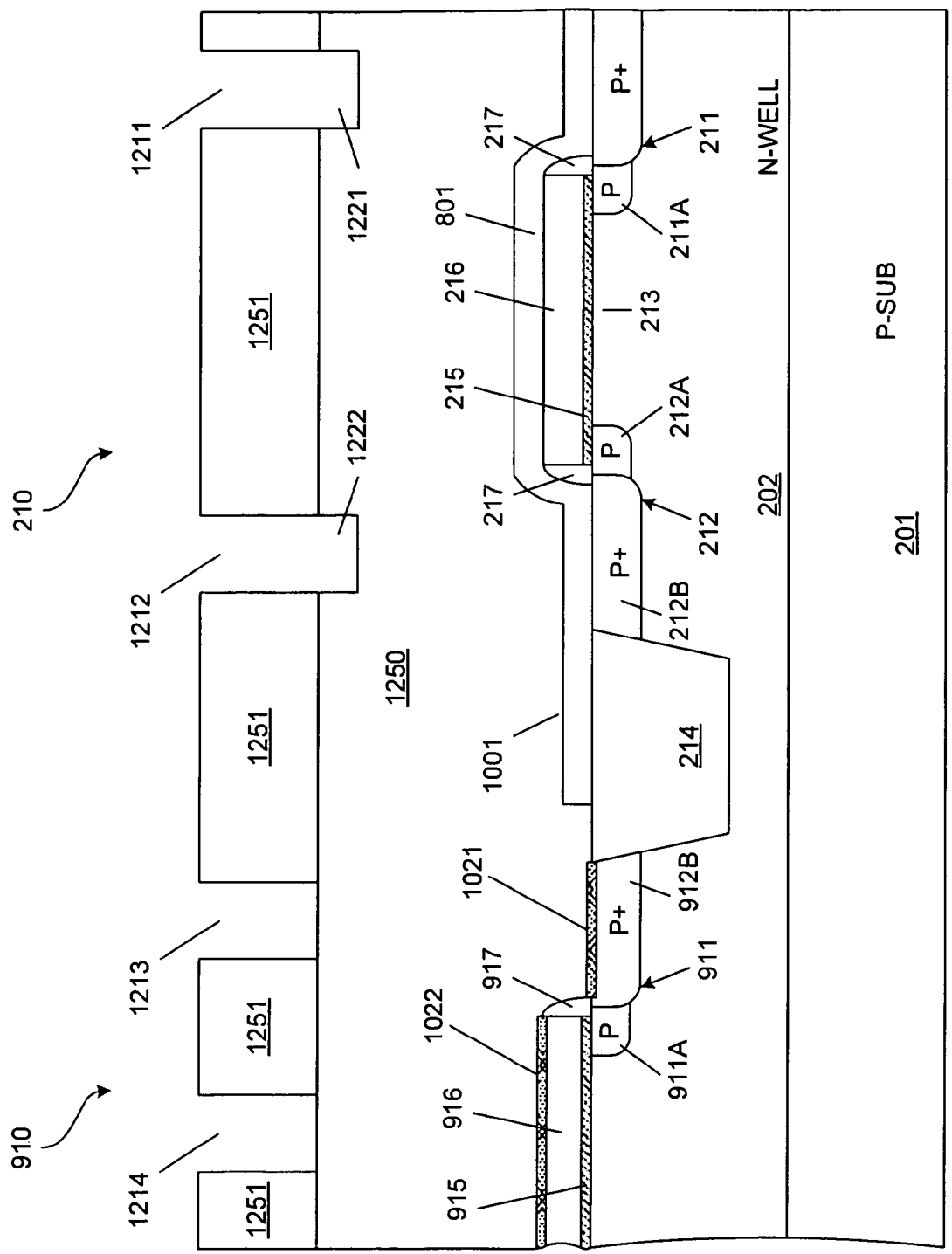

As illustrated in FIG. 12C, photoresist layer 1251 is exposed and developed a second time, thereby forming openings 1213 and 1214, which define the locations where contacts to silicide regions 1021 and 1022 are to be formed. The second exposure/develop step represents an additional step in a convention logic process.

Figure 12D:
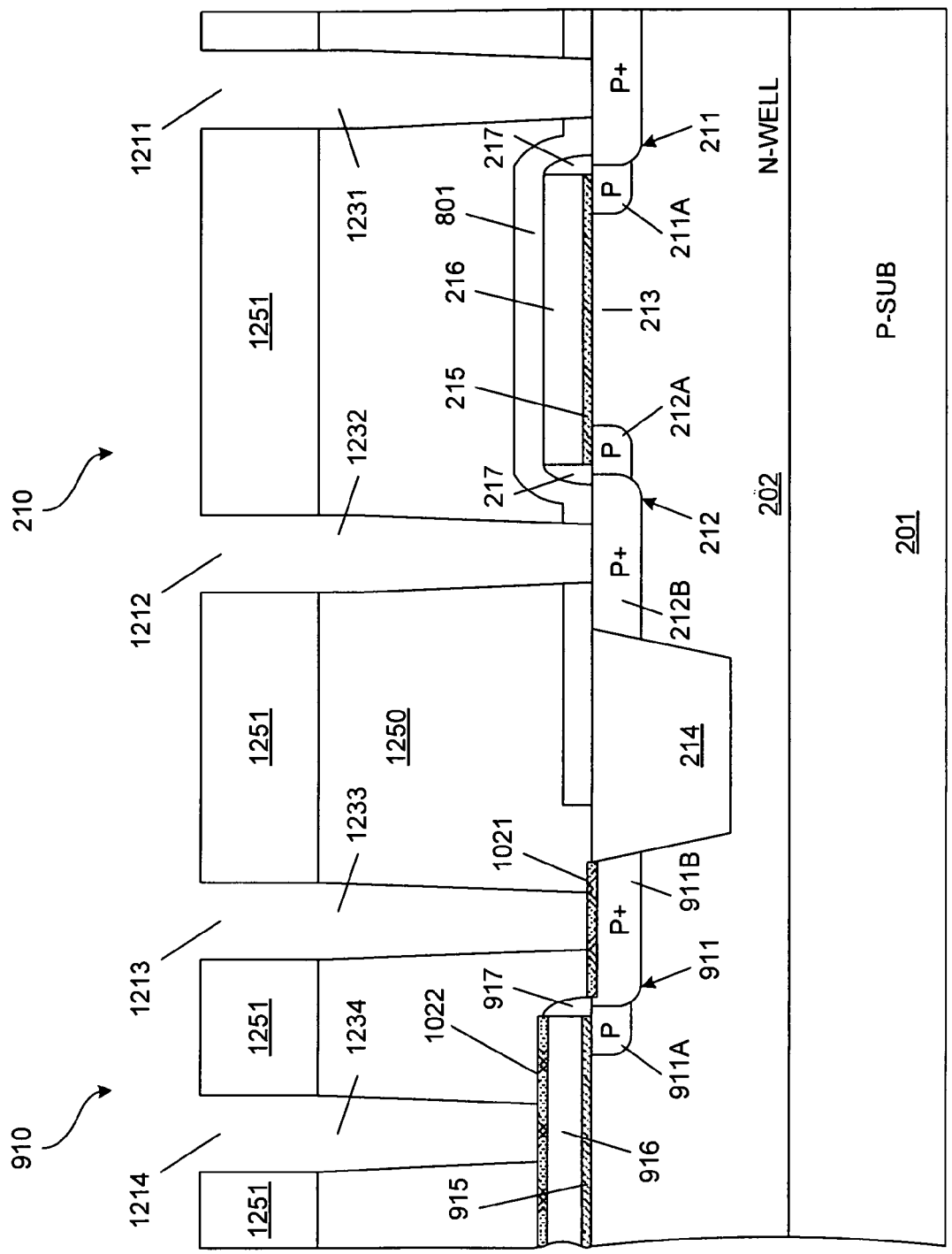
Figure 12E:
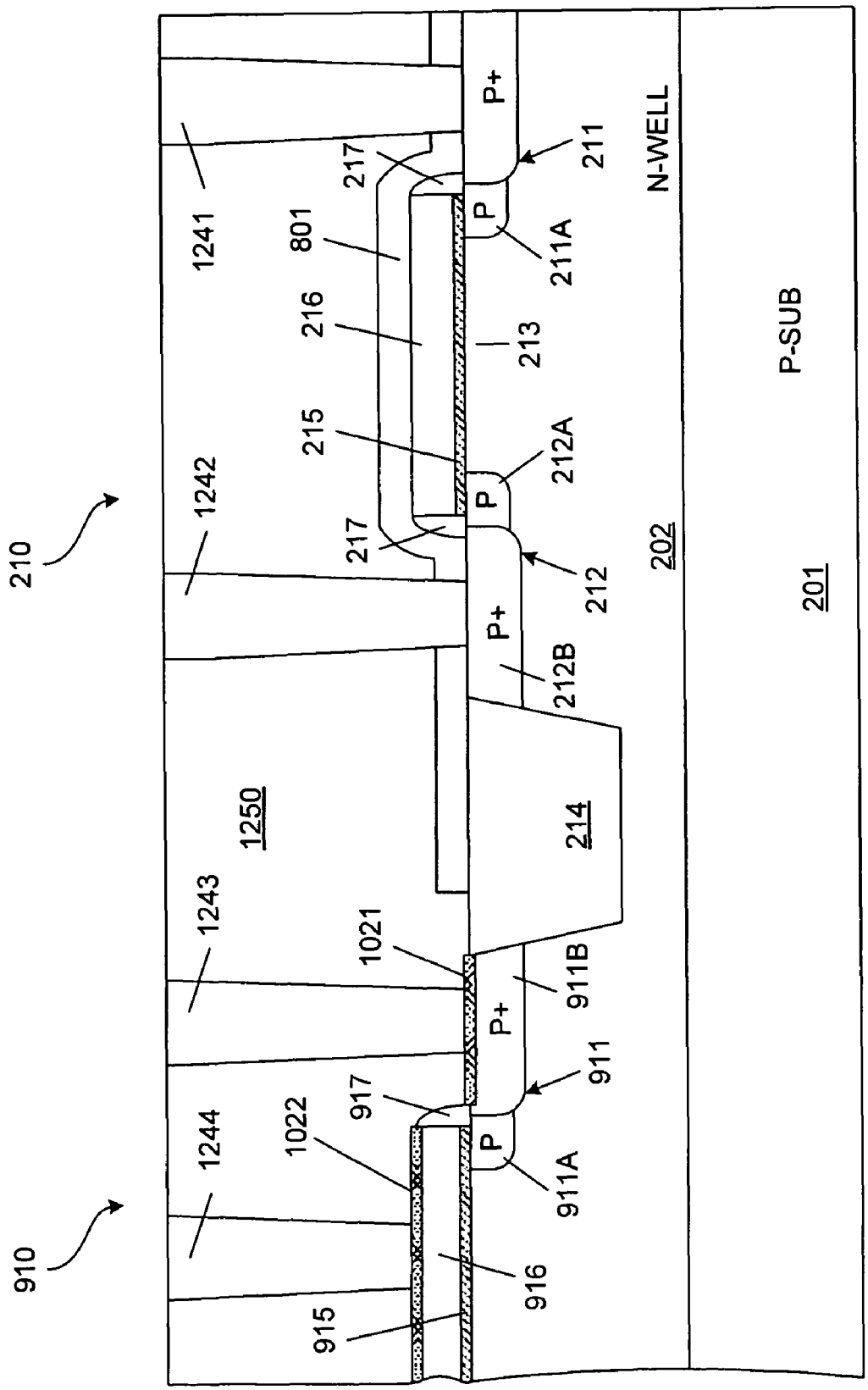

As illustrated in FIG. 12D, a conventional contact etch is performed through openings 1211-1214 of photoresist mask 1251, thereby forming contact openings 1231-1234, which expose p-type source 211, p-type drain 212, silicide region 1021 and silicide region 1022, respectively. Partially etched regions 1221-1222 ensure that this contact etch reliably extends completely through silicide-blocking dielectric region 801. Photoresist mask 1251 is then stripped, and contacts 1241-1244 are formed in contact openings 1231-1234, respectively, as illustrated in FIG. 12E.

Figure 13:
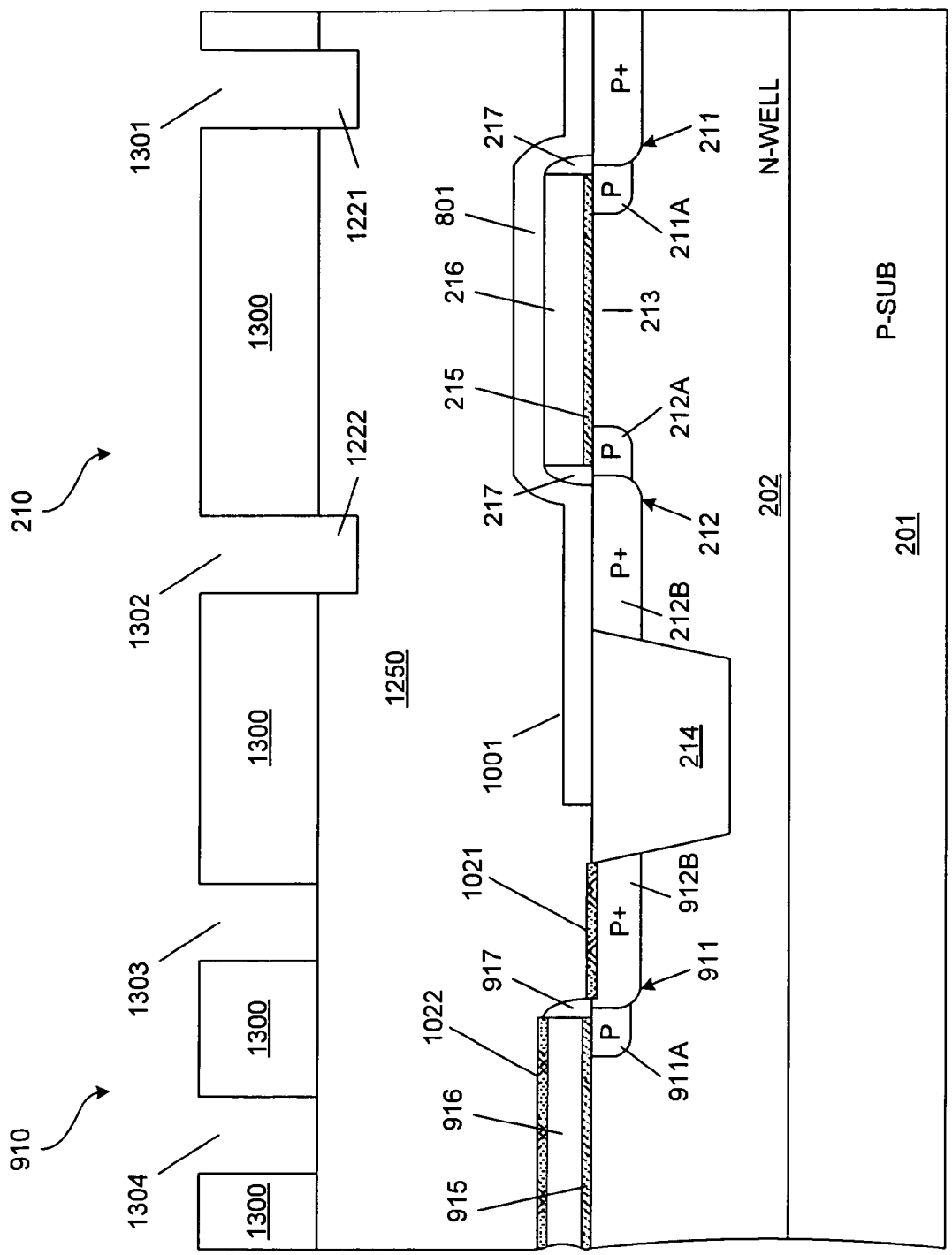
FIG. 13 is a cross-sectional view of a logic device and an access transistor of an NVM cell, which illustrates a variation of the embodiment of FIGS. 12A-12E.

FIG. 13 is a cross-sectional view of access transistor 210 and logic transistor 910, which illustrates a variation of the embodiment of FIGS. 12A-12E. As illustrated in FIG. 13, the photoresist mask 1251 of FIG. 12B is stripped after NVM contact openings 1221 and 1222 have been formed by the partial etch step. A second photoresist mask 1300 is then formed over the resulting structure, as illustrated in FIG. 13. Photoresist mask 1300 includes openings 1301-1304, which are located in the same locations as openings 1211-1214, respectively, in the photoresist mask 1251 of FIG. 12C. Processing continues in the manner described above in connection with FIGS. 12C-12E.

Although the present invention has been described in connection with several embodiments, it is understood that this invention is not limited to the embodiments disclosed, but is capable of various modifications which would be apparent to one of ordinary skill in the art. Thus, although the present invention has been described in conjunction with a particular planar NVM cell using a single layer of gate electrode material, it is understood that the general nature of the present invention does not preclude application to any planar NVM cell. In other embodiments, openings in the pre-metal dielectric structure can be etched through hard-mask film openings serving as etch windows, while hard-mask film openings themselves are defined by patterned photoresist. Thus, the invention is limited only by the following claims.

We claim:

1. A method of fabricating a non-volatile memory cell comprising:
    forming a plurality of active regions in a semiconductor substrate;
    forming a floating gate electrode over first portions of the active regions, the floating gate electrode connecting various elements of the non-volatile memory cell;
    forming a patterned silicide-blocking layer over the floating gate electrode, whereby the patterned silicide-blocking layer fully covers and prevents silicide formation on the portions of the floating gate electrode located over the active regions;
    forming the silicide, wherein the patterned silicide-blocking layer prevents silicide formation on the portions of the floating gate electrode located over the active semiconductor regions; then
    forming a pre-metal dielectric over the silicide and the patterned silicide-blocking layer;
    forming a first mask over the pre-metal dielectric, wherein the first mask includes openings where contacts are to be formed through the patterned silicide-blocking layer;
    performing a partial etch of the pre-metal dielectric through the openings in the first mask;
    forming a second mask over the pre-metal dielectric, wherein the second mask includes openings where all contacts are to be formed; and then
    performing a contact etch through the openings of the second mask, wherein the contact etch extends through the patterned silicide-blocking layer.

2. The method of claim 1, wherein the step of forming the patterned silicide-blocking layer comprises exposing second portions of the active regions, the method further comprising forming the silicide on the exposed second portions of the active regions.

3. The method of claim 2, wherein the step of forming the patterned silicide-blocking layer results in the patterned silicide-blocking layer extending over active semiconductor regions of adjacent non-volatile memory cells.

4. The method of claim 1, further comprising using the patterned silicide-blocking layer to prevent silicide formation on at least one of the active regions.

5. The method of claim 1, further comprising:
    doping a first region of the floating gate electrode with p-type impurities; and
    doping a second region of the floating gate electrode with n-type impurities, wherein a p-n interface is formed in the floating gate electrode.

6. The method of claim 5, further comprising:
    forming an active region isolation region in the semiconductor substrate; and
    forming the p-n interface over the active isolation region.

7. The method of claim 6, wherein the step of forming the patterned silicide-blocking layer comprises exposing the p-n interface of the floating gate electrode, the method further comprising forming the silicide on the exposed p-n interface of the floating gate electrode.

8. The method of claim 1, further comprising:
    forming a dielectric sidewall spacer adjacent to the floating gate electrode; and forming the patterned silicide-blocking layer such that the patterned silicide-blocking layer covers the dielectric sidewall spacer.

9. The method of claim 1, further comprising forming silicide regions on at least one of the active regions, the silicide regions being located entirely within, and separated from, edges of the at least one of the active regions.

10. The method of claim 1, wherein the step of forming the second mask comprises depositing a hard-mask film.

11. The method of claim 1, further comprising:
forming the first mask by forming a first set of openings through a photoresist layer; and
forming the second mask by subsequently forming a second set of openings through the photoresist layer.

12. The method of claim 1, further comprising:
forming the first mask by forming a first set of openings through a first photoresist layer; and
forming the second mask by forming a second set of openings through a second photoresist layer.

13. The method of claim 1, wherein the contact etch exposes the silicide and the plurality of active regions.

14. The method of claim 1, further comprising removing the first mask prior to forming the second mask.

15. The method of claim 1, further comprising fabricating the non-volatile memory cell using a single-gate process.

16. A method of fabricating a non-volatile memory system comprising:
fabricating a non-volatile memory cell;
forming a patterned silicide-blocking layer over the non-volatile memory cell;
forming silicide, wherein the patterned silicide-blocking layer prevents silicide formation on the non-volatile memory cell; then
forming a pre-metal dielectric over the patterned silicide-blocking layer;
forming a first mask over the pre-metal dielectric, wherein the first mask includes openings where contacts are to be formed through the patterned silicide-blocking layer;
performing a partial etch of the pre-metal dielectric through the openings in the first mask;
forming a second mask over the pre-metal dielectric, wherein the second mask includes openings where all contacts are to be formed; and then
performing a contact etch through the openings of the second mask, wherein the contact etch extends through the patterned silicide-blocking layer.

17. The method of claim 16, wherein the non-volatile memory cell is fabricated by:
forming a plurality of active regions in a semiconductor substrate, wherein at least two of these active regions are separated by a field dielectric region; and
forming a floating gate electrode over portions of the plurality of active regions.

18. The method of claim 17, wherein the contact etch exposes the silicide and the plurality of active regions.

19. The method of claim 17, further comprising:
forming a dielectric sidewall spacer adjacent to the floating gate electrode; and
forming the patterned silicide-blocking layer such that the patterned silicide-blocking layer covers the dielectric sidewall spacer.

20. The method of claim 16, further comprising:
forming the first mask by forming a first set of openings through a photoresist layer; and
forming the second mask by subsequently forming a second set of openings through the photoresist layer.

21. The method of claim 16, further comprising removing the first mask prior to forming the second mask.

22. The method of claim 16, further comprising fabricating the non-volatile memory cell using a single-gate process.

23. A method of fabricating a non-volatile memory system comprising:
fabricating a non-volatile memory cell;
forming a patterned silicide-blocking layer over the non-volatile memory cell;
forming silicide, wherein the patterned silicide-blocking layer prevents silicide formation on the non-volatile memory cell; then
forming a pre-metal dielectric over the patterned silicide-blocking layer;
forming a first mask over the pre-metal dielectric, wherein the first mask includes a first set of openings;
performing a partial etch of the pre-metal dielectric through the first set of openings in the first mask;
forming a second mask over the pre-metal dielectric, wherein the second mask includes a second set of openings, wherein a subset of the second set of openings are in the same locations as the first set of openings; and then
performing a contact etch through the second set of openings, wherein the contact etch extends through the patterned silicide-blocking layer.

24. The method of claim 23, wherein the non-volatile memory cell is fabricated by:
forming a plurality of active regions in a semiconductor substrate, wherein at least two of these active regions are separated by a field dielectric region; and
forming a floating gate electrode over portions of the plurality of active regions.

25. The method of claim 24, wherein the contact etch exposes the silicide and the plurality of active regions.

26. The method of claim 24, further comprising:
forming a dielectric sidewall spacer adjacent to the floating gate electrode; and
forming the patterned silicide-blocking layer such that the patterned silicide-blocking layer covers the dielectric sidewall spacer.

27. The method of claim 23, further comprising:
forming the first mask by forming the first set of openings through a photoresist layer; and
forming the second mask by subsequently forming another set of openings through the photoresist layer.

28. The method of claim 23, further comprising removing the first mask prior to forming the second mask.

29. The method of claim 23, further comprising fabricating the non-volatile memory cell using a single-gate process.

* * * * *